(12) United States Patent
Chuang et al.

(10) Patent No.: US 11,683,930 B2
(45) Date of Patent: Jun. 20, 2023

(54) METHOD OF FABRICATING SEMICONDUCTOR DEVICE

(71) Applicant: NANYA TECHNOLOGY CORPORATION, New Taipei (TW)

(72) Inventors: Da-Zen Chuang, Taipei (TW);
Pin-Hsiu Hsieh, Taoyuan (TW);
Chih-Chung Sun, Zhubei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 17/403,158

(22) Filed: Aug. 16, 2021

(65) Prior Publication Data

US 2021/0375882 A1    Dec. 2, 2021

Related U.S. Application Data

(62) Division of application No. 16/584,006, filed on Sep. 26, 2019, now Pat. No. 11,133,321.

(51) Int. Cl.

| H01L 27/108 | (2006.01) |
| H10B 12/00 | (2023.01) |
| H01F 10/32 | (2006.01) |
| H01L 23/58 | (2006.01) |
| H01L 29/49 | (2006.01) |

(Continued)

(52) U.S. Cl.
CPC ............ H10B 12/50 (2023.02); G11C 11/161 (2013.01); H01F 10/329 (2013.01); H01F 10/3254 (2013.01); H01L 21/28035 (2013.01); H01L 23/528 (2013.01); H01L 23/5226 (2013.01); H01L 23/585 (2013.01); H01L 29/401 (2013.01); H01L 29/4916 (2013.01); H10B 12/053 (2023.02); H10B 12/315 (2023.02); H10B 12/34 (2023.02); H10B 12/482 (2023.02); H10B 61/22 (2023.02); H10N 50/01 (2023.02); H10N 50/80 (2023.02)

(58) Field of Classification Search
CPC .. H01L 23/5226; H01L 23/528; H01L 23/585
USPC .......................................................... 257/296
See application file for complete search history.

(56) References Cited

U.S. PATENT DOCUMENTS

| 2012/0051143 A1 | 3/2012 | Yoon et al. |
| 2013/0234254 A1 | 9/2013 | Ng et al. |

(Continued)

FOREIGN PATENT DOCUMENTS

| TW | 201924046 A | 6/2019 |
| TW | 201926653 A | 7/2019 |
| TW | 201937700 A | 9/2019 |

OTHER PUBLICATIONS

Office Action and Search Report of the corresponding Taiwanese application No. TW108140262 dated Nov. 24, 2020.

*Primary Examiner* — Dzung Tran
(74) *Attorney, Agent, or Firm* — Muncy, Geissler, Olds & Lowe, P.C.

(57) ABSTRACT

The present disclosure provides a method of fabricating a semiconductor device. The method includes: providing a semiconductor substrate comprising a memory region and a logic region; forming a memory gate in or on the memory region; forming a plurality of first poly-silicon gates on the memory region and surrounding the memory gate; and forming a plurality of second poly-silicon gates on the logic region simultaneously with the formation of the first poly-silicon gates.

3 Claims, 20 Drawing Sheets

(51) Int. Cl.
*H01L 21/28* (2006.01)
*H01L 29/40* (2006.01)
*H01L 23/528* (2006.01)
*H01L 23/522* (2006.01)
*G11C 11/16* (2006.01)
*H10B 61/00* (2023.01)
*H10N 50/01* (2023.01)
*H10N 50/80* (2023.01)

(56) References Cited

U.S. PATENT DOCUMENTS

| | | |
|---|---|---|
| 2013/0279262 A1 | 10/2013 | Yoon et al. |
| 2014/0264538 A1 | 9/2014 | Yu et al. |
| 2014/0306296 A1* | 10/2014 | Jeon .................. H01L 21/76895 438/283 |
| 2015/0084111 A1 | 3/2015 | Wu et al. |
| 2015/0331985 A1* | 11/2015 | Sharma .................. G06F 30/39 716/135 |
| 2016/0064082 A1 | 3/2016 | Hong et al. |
| 2016/0148944 A1 | 5/2016 | Yu et al. |
| 2017/0179140 A1* | 6/2017 | Ozawa .............. H01L 27/11514 |
| 2017/0317035 A1* | 11/2017 | Kim ...................... H01L 23/585 |
| 2018/0122809 A1* | 5/2018 | Lin ....................... H01L 23/585 |
| 2019/0172942 A1 | 6/2019 | Yang et al. |

\* cited by examiner

METHOD OF FABRICATING SEMICONDUCTOR DEVICE

CROSS-REFERENCE TO RELATED APPLICATION

This application is a divisional application of U.S. Non-Provisional application Ser. No. 16/584,006 filed Sep. 26, 2019, which is incorporated herein by reference in its entirety.

TECHNICAL FIELD

The present disclosure relates to a method of fabricating a semiconductor device, and more particularly, to a method of fabricating a die having a memory integrated with a logic circuit.

DISCUSSION OF THE BACKGROUND

As device packing density increases, integrated-circuit devices have been developed in a form where a memory (i.e., a dynamic random access memory (DRAM)) and a logic circuit are combined in one chip as a precursor of a system on chip product for meeting various consumer demands. Recently, because the integrated composite chip has advantages of providing a small, high-speed device featuring low electromagnetic interference (EMI) and low power consumption, research and development of the integrated composite chip has been progressing rapidly. However, due to the need to simultaneously consider aspects of fabrication of both the memory and the logic circuit, the fabrication of the integrated composite chip itself is complex and challenging.

This Discussion of the Background section is for background information only. The statements in this Discussion of the Background are not an admission that the subject matter disclosed in this section constitutes a prior art to the present disclosure, and no part of this section may be used as an admission that any part of this application, including this Discussion of the Background section, constitutes prior art to the present disclosure.

SUMMARY

One aspect of the present disclosure provides a semiconductor device. The semiconductor device includes a semiconductor substrate, a memory cell, a first logic transistor, and a second logic transistor. The semiconductor substrate includes a memory region and a logic region. The memory cell is disposed in the memory region. The first logic transistor is disposed in the memory region and disposed adjacent to the memory cell. The second logic transistor is disposed in the logic region. The first logic transistor is configured to control operation of the memory cell in response to a memory control signal provided by the second logic transistor.

In some embodiments, the memory control signal includes a command signal.

In some embodiments, the second logic transistor serves as a component of a processing unit defined by a control unit (CU) and an arithmetic logic unit (ALU).

In some embodiments, the memory cell comprises a memory transistor configured to communicate with the second logic transistor via the first logic transistor.

In some embodiments, the semiconductor device further includes a first semiconductor memory including the memory cell and the first logic transistor, and a second semiconductor memory. The first semiconductor memory and the second semiconductor memory are a dynamic random access memory (DRAM). The semiconductor device further includes a processing unit including the second logic transistor, and a static random-access memory (SRAM). Data latency of the first semiconductor memory is less than or equal to that of the second semiconductor memory, and data latency of the SRAM is less than or equal to that of the first semiconductor memory.

In some embodiments, data density of the first semiconductor memory is less than or equal to that of the second semiconductor memory, and data density of the SRAM is less than or equal to that of the first semiconductor memory.

In some embodiments, the first logic transistor is level with the second logic transistor.

In some embodiments, the semiconductor device further includes a dielectric layer. The dielectric layer is disposed on the semiconductor substrate, wherein the memory cell includes a buried gate disposed beneath the dielectric layer, wherein the first logic transistor includes a first logic gate disposed in the dielectric layer, and wherein the second logic transistor includes a second logic gate disposed in the dielectric layer.

In some embodiments, the semiconductor device further includes a guard ring. The guard ring is disposed on the semiconductor substrate and surrounds the memory cell, the first logic transistor and the second logic transistor.

In some embodiments, the semiconductor device further includes a patterned conductive layer extending above the semiconductor substrate, wherein the memory control signal is transmitted on the patterned conductive layer.

In some embodiments, the first logic transistor is configured to convert the memory control signal into a word line select signal and a bit line select signal, which are transmitted on the patterned conductive layer.

In some embodiments, the first logic transistor and the second logic transistor have the same semiconductor structure profile.

In some embodiments, the first logic transistor and the second logic transistor have the same component.

In some embodiments, the component of the first logic transistor and the component of second logic transistor include the same semiconductor material.

Another aspect of the present disclosure provides a semiconductor device. The semiconductor device includes a semiconductor substrate, a memory cell, a plurality of first logic transistors, a plurality of second logic transistors and a plurality of third logic transistors. The semiconductor substrate includes a memory region and a logic region. The memory cell is disposed in the memory region. The first logic transistors are disposed in the memory region and surround the memory cell. The second logic transistors are disposed in the logic region. The third logic transistors are disposed on and in the logic region and surround the second logic transistors.

In some embodiments, the semiconductor device further includes a guard ring disposed on the semiconductor substrate and surrounding the memory cell, the first logic transistors, the second logic transistors, and the third logic transistors.

In some embodiments, the semiconductor device further includes a guard ring disposed on the semiconductor substrate, wherein the memory cell is disposed between the second logic transistor and the guard ring.

Another aspect of the present disclosure provides a method of fabricating a semiconductor device. The method includes: providing a semiconductor substrate comprising a memory region and a logic region; forming a memory gate in or on the memory region; forming a plurality of first poly-silicon gates on the memory region and surrounding the memory gate; and forming a plurality of second poly-silicon gates on the logic region simultaneously with the formation of the first poly-silicon gates.

In some embodiments, the method further includes: forming a guard ring on the semiconductor substrate and surrounding the memory gate, the first poly-silicon gates and the second poly-silicon gates.

In some embodiments, the formation of the first poly-silicon gates and the second poly-silicon gates includes: forming a gate oxide layer on the memory region and the logic region; forming a poly-silicon layer on the gate oxide layer and extending over the memory region and the logic region; forming an oxide layer on the poly-silicon layer and extending over the memory region and the logic region; and forming the first poly-silicon gates and the second poly-silicon gates by patterning the gate oxide layer, the poly-silicon layer and the oxide layer.

A foundry that focuses on DRAM fabrication would typically be familiar with factors relating to simultaneous fabrication of both a memory device (i.e., a memory cell array implemented with a buried-gate transistor) and a logic circuit (i.e., a peripheral circuit for the memory cell array). The processing unit, such as a CPU, is also a logic circuit. Therefore, such foundry would have the ability to simultaneously manufacture the CPU and the DRAM on a single semiconductor substrate by, for example, a complementary metal-oxide-semiconductor (CMOS) fabrication process. With such integration, some of the memory spaces previously provided by the SRAM of the CPU would be assumed by the DRAM, and therefore memory space of the SRAM could be reduced. As a result, a memory density would be relatively high, compared to an existing processing unit that is not fabricated with a DRAM on the same semiconductor substrate.

Moreover, data exchange between the processing unit and the DRAM occurs within the die. Data exchange with an object external to the die is eliminated, or significantly reduced.

In addition, since the processing unit and the DRAM are produced on the same single semiconductor substrate, only one chip is produced. No system in package (SiP) is required to stack the processing unit on the DRAM. As a result, complexity in design, process and variation can be significantly decreased.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should be understood to be connected to the figures' reference numbers, which refer to similar elements throughout the description.

DETAILED DESCRIPTION

Figure 1:
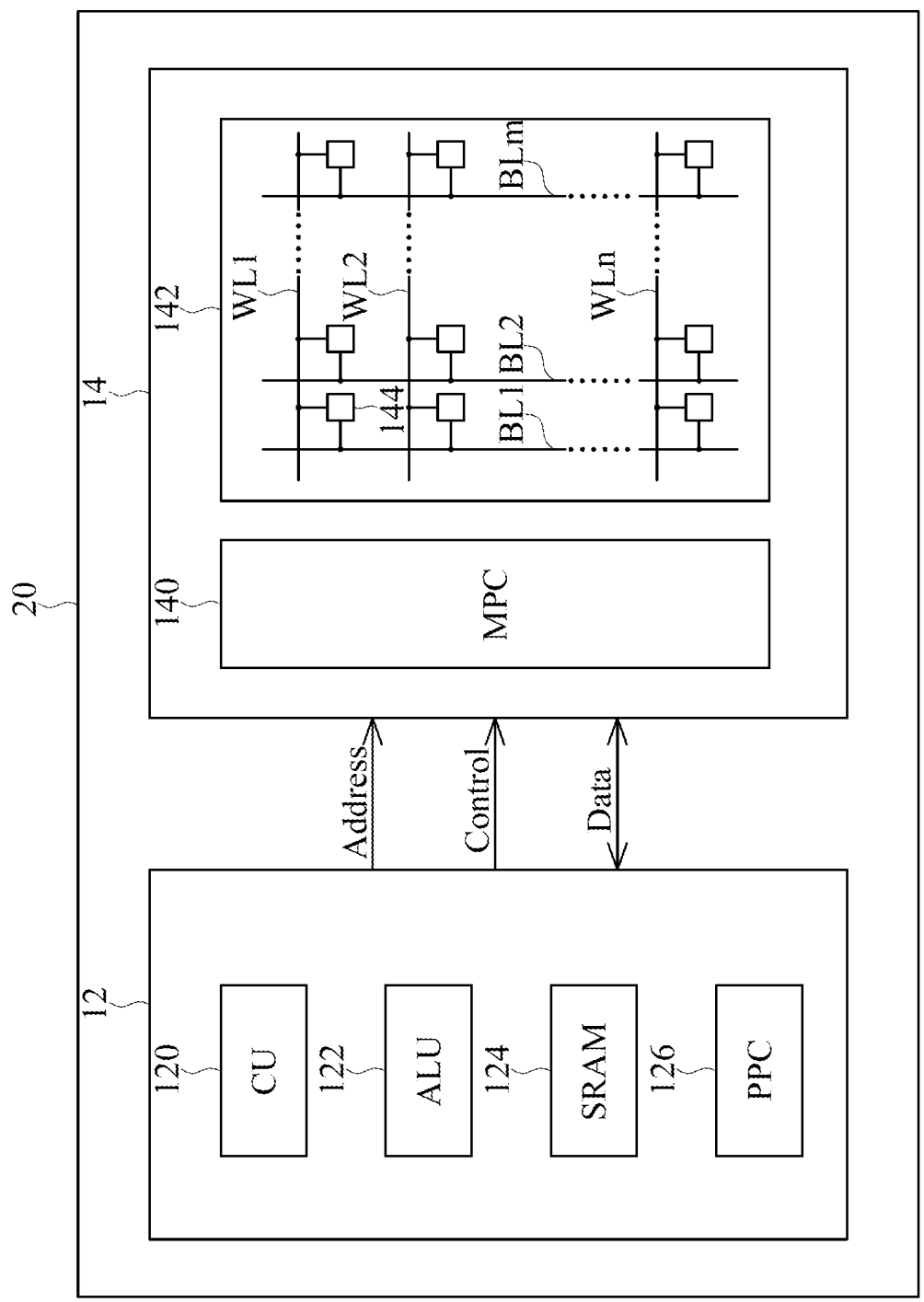
FIG. 1 is a schematic diagram of a semiconductor device, in accordance with some embodiments of the present disclosure.

Embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Throughout the various views and illustrative embodiments, like reference numerals are used to designate like elements. Reference will now be made in detail to exemplary embodiments illustrated in the accompanying drawings. Wherever possible, the same reference numbers are used in the drawings and the description to refer to the same or like parts. In the drawings, the shape and thickness of features may be exaggerated for clarity and convenience. This description will be directed in particular to elements forming part of, or cooperating more directly with, an apparatus in accordance with the present disclosure. It should be understood that elements not specifically shown or described may take various forms. Reference throughout this specification to "some embodiments" or "an embodiment" means that a particular feature, structure, or characteristic described in connection with the embodiment is included in at least one embodiment. Thus, the appearance of the phrases "in some embodiments" or "in an embodiment" in various places throughout this specification does not necessarily refer to the same embodiment. Furthermore, the particular features, structures, or characteristics may be combined in any suitable manner in one or more embodiments.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. A person having ordinary skill in the art will appreciate the many possible applications and variations of the present invention based on the following illustrative embodiments of the present invention.

Unless otherwise defined, all terms (including technical and scientific terms) used herein have the same meanings as those commonly understood by a person having ordinary skill in the art to which the embodiments of the present disclosure belong. It should be understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

FIG. 1 is a schematic diagram of a semiconductor device 5, in accordance with some embodiments of the present disclosure. Referring to FIG. 1, the semiconductor device 5 is a system on a chip (SOC) device. The semiconductor device 5 is made of different semiconducting materials on a single semiconductor substrate 20. Moreover, the semiconductor device 5 is designed to undergo a semiconductor package process other than, for example, a system in package (SiP) process for integrating two independent dies.

The semiconductor device 5 includes a processing unit 12 and a semiconductor memory 14. The semiconductor memory 14 may be referred to as a first semiconductor memory, if appropriate.

The processing unit 12 functions to follow an instruction cycle. The instruction cycle is followed by the processing unit 12 to process instructions from boot-up until, for example, a computer has shut down. The instruction cycle is composed of three main stages: a fetch stage, a decode stage, and an execute stage.

In some embodiments, the processing unit 12 includes standard processors, such as a field programmable gate array (FPGA), a central processing unit (CPU), a graphic processing unit (GPU), an application specific integrated circuit (ASIC), an application-specific standard part (ASSP), and a micro control unit (MCU). However, the present disclosure is not limited thereto. In some embodiments, the processing unit 12 may include another suitable processing device.

The processing unit 12 includes a logic circuit having a control unit (CU) 120 and an arithmetic logic unit (ALU) 122, a static random-access memory (SRAM) 124, and a processing peripheral circuit (PPC) 126.

The CU 120 functions to direct operations within the processing unit 12. In some embodiments, the CU 120 directs the computer's logic unit, memory, and input and output devices in response to instructions received from a program.

The ALU 122, coupled to the CU 120, functions to perform both bitwise and mathematical operations on binary numbers. The ALU 122 is the last component to perform calculations in the processing unit 12. The ALU 122 performs operations on input data based on operands and code received. After the information has been processed by the ALU 122, the processed information is sent to the semiconductor memory 14.

The SRAM 124, coupled to the CU 120 and the ALU 122, functions to serve as a cache of the processing unit 12, wherein the SRAM 124 is a first-level cache. The SRAM 124 may be referred to as a second semiconductor memory, if appropriate.

The PPC 126 functions as a communication interface for communication between the logic circuit of the processing unit 12 and electrical components, such as the semiconductor memory 14, external to the processing unit 12. In structure, for example, the logic circuit is not directly coupled to the semiconductor memory 14. Rather, the logic circuit is directly coupled to the PPC 126, and then indirectly coupled to the semiconductor memory 14 via the PPC 126.

The semiconductor memory 14, coupled to the processing unit 12, functions to store instructions required in the instruction cycle and functions to serve as a main memory of the processing unit 12.

In some embodiments, the semiconductor memory 14 includes a volatile memory or a non-volatile memory. The non-volatile memory includes a magnetoresistive random access memory (MRAM), a resistive random-access memory (ReRAM), a conductive bridge memory (CBM), a phase-change memory (PCM), a nano-tube ram (NRAM), a ferroelectric field-effect transistor (FeFET) memory, a 3D Xpoint (3DXP) memory, or a flash memory. The volatile memory includes a dynamic random-access memory (DRAM).

The semiconductor memory 14 includes a memory cell array 142 and a memory peripheral circuit (MPC) 140. The memory cell array 142 includes a plurality of word lines WL1 to WLn, a plurality of bit lines BL1 to BLm, and a plurality of memory cells 144, wherein n and m are positive integers and are greater than 1. The memory cells 144 are arranged in columns and rows. The memory cell 144 is disposed at each intersection of a word line with a bit line, and functions to store data in a digital binary form. The memory cell 144, for example, includes a storage device for storing data, and a memory transistor for performing cell selection. In an embodiment where the semiconductor memory 14 is a DRAM, the storage device includes a capacitor. In another embodiment where the semiconductor memory 14 is an MRAM, the storage device includes a magnetic tunneling junction (MJT) transistor.

The MPC 140 functions as a communication interface for communication between the memory cell array 142 and electrical components, such as the processing unit 12, external to the semiconductor memory 14. In structure, for example, the memory cell array 142 is not directly coupled to the processing unit 12. Rather, the memory cell array 142 is directly coupled to the MPC 140, and then indirectly coupled to the processing unit 12 via the MPC 140.

In addition, the MPC 140 functions to control the memory cell array 142. The MPC 140 includes, for example, a row decoder, a column decoder, an address buffer, an input/output (I/O) buffer, a clock generator, a direct-current (DC) generator and a sense amplifier (S/A).

In operation, the processing unit 12 generates and provides a data signal Data, an address signal ADD, and a memory control signal Control to the MPC 140 to access the memory cell array 142. In some embodiments, the memory control signal Control includes a command signal. However, the present disclosure is not limited thereto. In some embodiments, the memory control signal Control includes other suitable signals.

Figure 2:
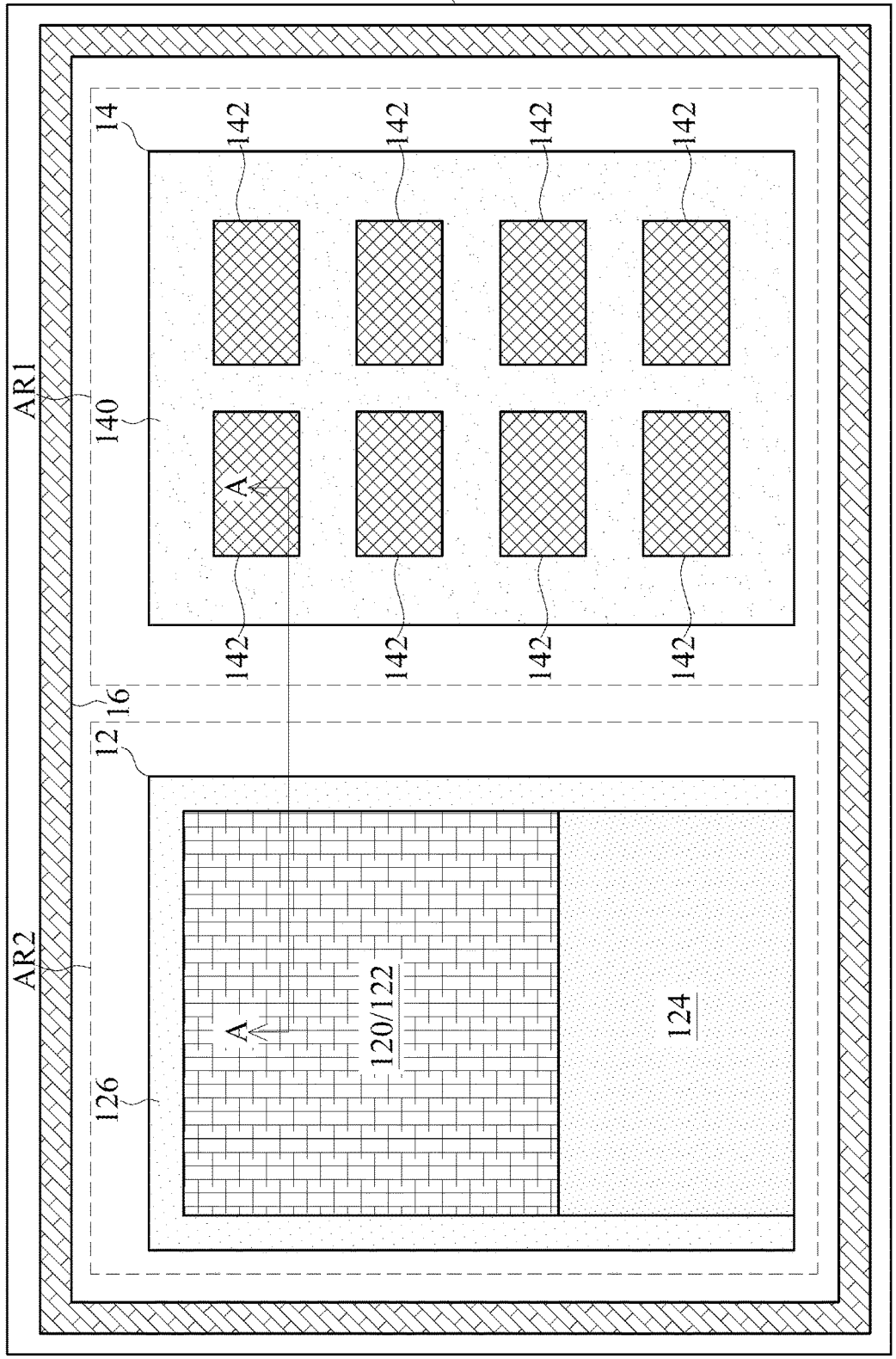
FIG. 2 is a plan view illustrating the layout implementing the semiconductor device shown in FIG. 1 on a semiconductor substrate, in accordance with some embodiments of the present disclosure.

FIG. 2 is a plan view illustrating the layout implementing the semiconductor device 5 shown in FIG. 1 on a semiconductor substrate 20, in accordance with some embodiments of the present disclosure. Referring to FIG. 2, the semiconductor substrate 20 of the semiconductor device 5 includes a memory region AR1, and a logic region AR2.

The memory cell arrays 142 are surrounded by the MPC 140. In other words, the MPC 140 is arranged along a periphery of the memory cell arrays 142.

The CU 120, the ALU 122 and the SRAM 124 are surrounded by the PPC 126. In other words, the PPC 126 is arranged along a periphery of the CU 120, a periphery of the ALU 122, and a periphery of the SRAM 124.

The semiconductor device 5 further includes a guard ring 16. The guard ring 16 is disposed on the semiconductor substrate 20. The processing unit 12 and the semiconductor memory 14 are jointly surrounded by the guard ring 16.

In the present disclosure, the guard ring 16 is a continuous structure. However, the present disclosure is not limited thereto. In other embodiments, the guard ring 16 is a non-continuous structure.

Figure 3:
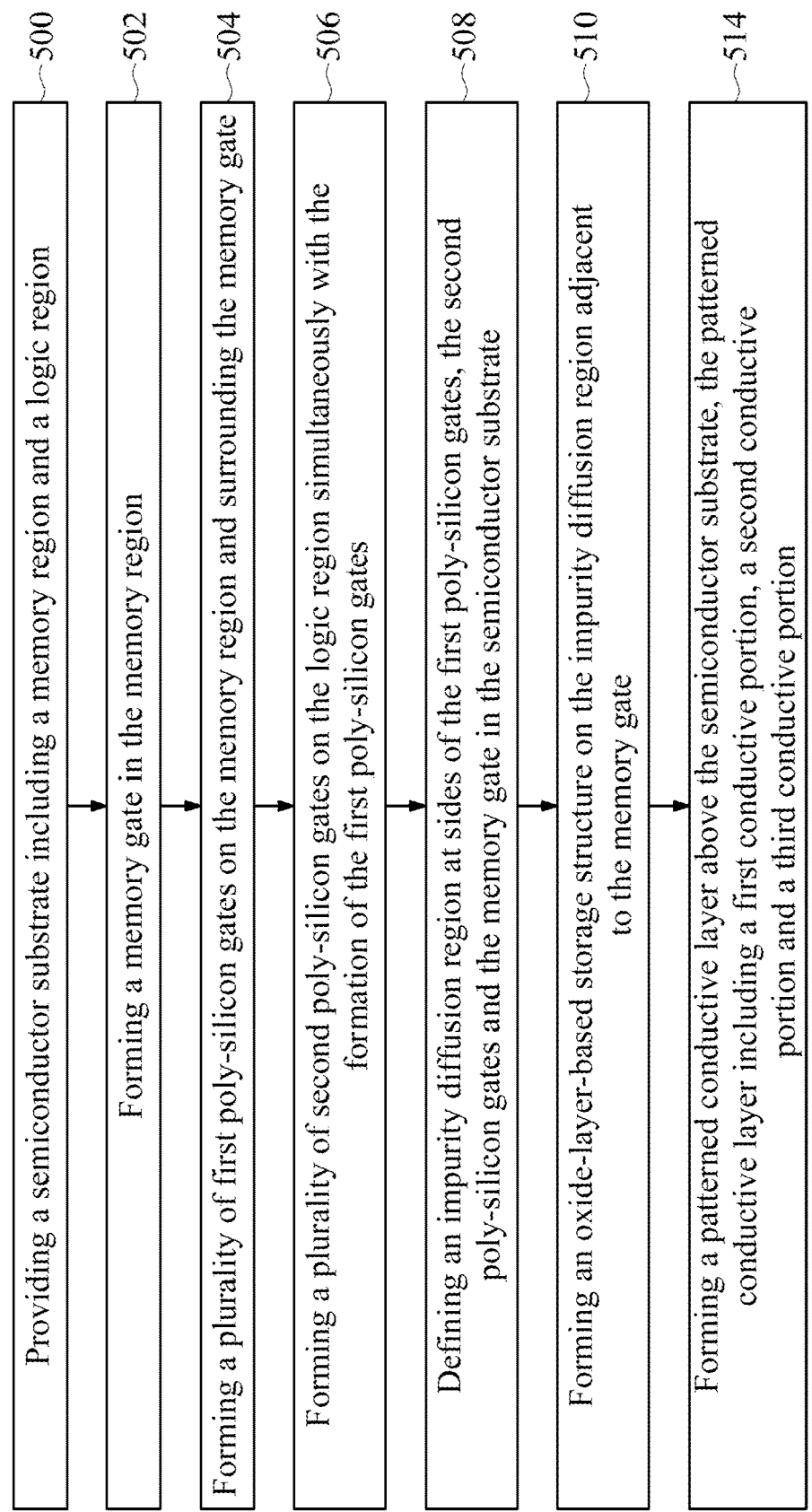
FIG. 3 is a flowchart of a method of fabricating a semiconductor device, in accordance with some embodiments of the present disclosure.

FIG. 3 is a flowchart of a method 50 of fabricating the semiconductor device 5, in accordance with some embodiments of the present disclosure. Referring to FIG. 3, the method 50 includes operations 500, 502, 504, 506, 508, 510 and 514. The operations 500 to 514 are described and illustrated with reference to an embodiment of the semiconductor device 5 including a DRAM as shown in FIGS. 4 to 13, and an embodiment of the semiconductor device 5 including an MRAM as shown in FIGS. 14 to 18. The embodiment of the semiconductor device 5 including a DRAM is introduced prior to the introduction of an embodiment of the semiconductor device 5 including an MRAM.

Figure 4:
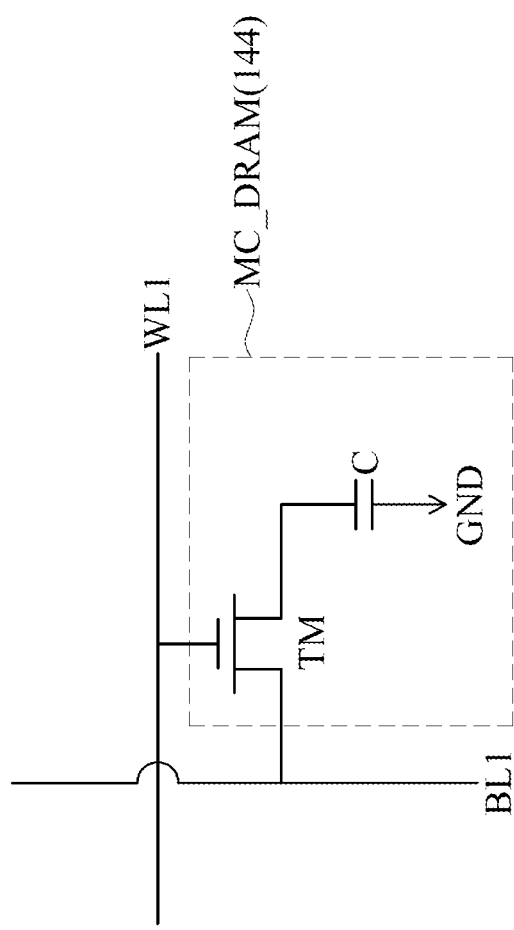
FIG. 4 is a circuit diagram of the memory cell shown in FIG. 1 in an embodiment wherein the semiconductor memory shown in FIG. 1 is a dynamic random access memory (DRAM), in accordance with some embodiments of the present disclosure.

FIG. 4 is a circuit diagram of the memory cell 144 shown in FIG. 1 in an embodiment wherein the semiconductor memory 14 is a DRAM, in accordance with some embodiments of the present disclosure. For brevity, only one memory cell 144 is illustrated and depicted.

Referring to FIG. 4, the memory cell 144 can be indicated by MC_DRAM. The memory cell 144 includes a memory transistor TM and a capacitor C. The capacitor C is coupled between the memory transistor TM and a reference ground GND.

The memory transistor TM functions to perform cell selection of the capacitor C. A drain of the memory transistor TM is coupled to the bit line BL1, a gate of the memory transistor TM is coupled to the word line WL1 for cell selection, and a source of the memory transistor TM is coupled to the capacitor C. In operation, when the memory transistor TM is switched to a conductive state, the associated capacitor C is selected.

In FIG. 4, only one memory transistor TM is depicted. Referring back to FIG. 1, the memory cell array 142 includes the plurality of memory cells 144, and therefore includes a plurality of memory transistors TM. The memory transistors TM are disposed in the memory region AR1, as shown in FIG. 2.

FIGS. 5 to 13 are cross-sectional views illustrating intermediate stages of fabrication of the semiconductor device 5 including the DRAM 14 taken along a line A-A shown in FIG. 2, in accordance with some embodiments of the present disclosure.

Figure 5:
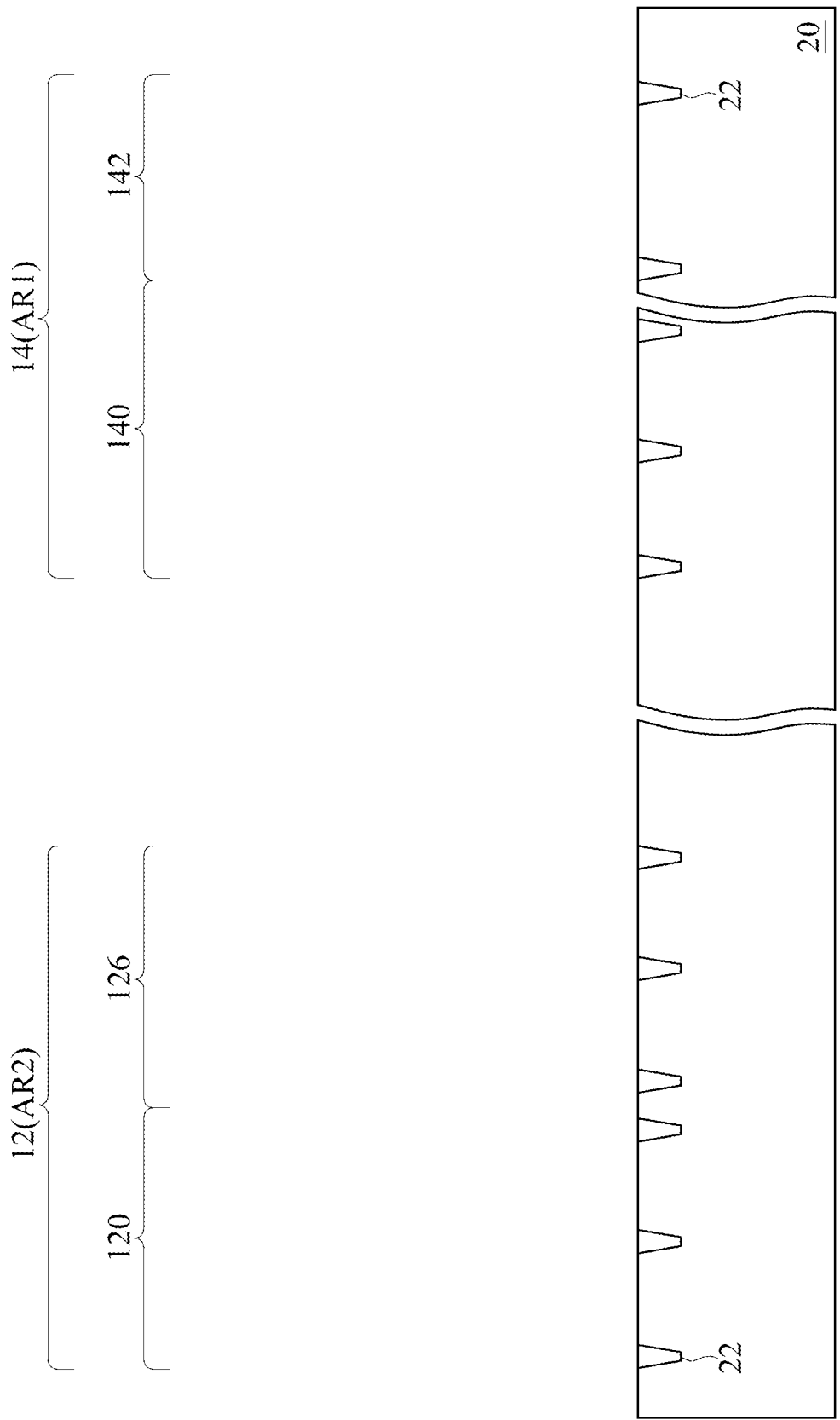
FIGS. 5 to 13 are cross-sectional views illustrating intermediate stages of fabrication of a semiconductor device including a DRAM taken along a line A-A shown in FIG. 2, in accordance with some embodiments of the present disclosure.

Referring to FIG. 5 and operation 500 in FIG. 3, the method 50 begins with operation 500, in which a semiconductor substrate 20 is provided. The semiconductor substrate 20 includes the memory region AR1, and the logic region AR2. The DRAM 14 is to be formed in and on the memory region AR1. The processing unit 12 is to be formed in and on the logic region AR2.

In some embodiments, the semiconductor substrate 20 is a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the semiconductor substrate 20 is a multilayered substrate, such as a silicon-on-insulator (SOI) substrate, which includes a bottom semiconductor layer, a buried oxide layer (BOX) and a top semiconductor layer.

In some embodiments, the semiconductor substrate 20 may be a p-type doped substrate, or an n-type doped substrate, which means that the semiconductor substrate 20 may be doped with either p-type or n-type impurities. The semiconductor substrate 20 is formed from silicon, gallium arsenide, silicon germanium, silicon carbon, or other known semiconductor materials used in semiconductor device processing.

It is common knowledge that dopant impurities can be implanted into a semiconductor material to form a p-type or an n-type material. A p-type material may be further classified as a p(+)(+), p(+), p, p(−), or p(−)(−) type material, depending on the concentration of the dopant. If a material is said to be a p-type material, it is doped with p-type impurities and may be any of the p(+)(+), p(+), p, p(−), or p(−)(−) type materials. Similarly, an n-type material may be further classified as an n(+)(+), n(+), n, n(−), or n(−)(−) type material. If a material is said to be an n-type material, it is doped with n-type impurities and may be any of the n(+)(+), n(+), n, n(−), or n(−)(−) type materials. Dopant atoms for p-type materials include boron, for example. In n-type materials, dopant atoms include phosphorous, arsenic, and antimony, for example. Doping may be performed through ion implantation processes. When coupled with photolithographic processes, doping may be performed in selected areas by implanting atoms into exposed regions while other areas are masked. Also, thermal drive or anneal cycles may be utilized in order to use thermal diffusion to expand or extend a previously doped region.

Isolation structures 22 are formed in the semiconductor substrate 20 by, for example, a shallow trench isolation (STI) method. A region defined between two isolation structures 22 becomes an active region where a transistor is formed. In some embodiments, the isolation structures 22 include a field oxide (FOX).

Generally, a silicon dioxide ($SiO_2$) layer is formed on the semiconductor substrate 20. A silicon nitride ($Si_3N_4$) layer is formed on the $SiO_2$ layer by, for example, a low-pressure chemical vapor deposition (LPCVD). A patterned photoresist layer is formed on the $Si_3N_4$ layer and leaves a portion of the $Si_3N_4$ layer exposed. A photolithography process is performed to remove the portion of the $Si_3N_4$ layer, exposing a portion of the $SiO_2$ layer. The portion of the $SiO_2$ layer is transformed into the FOX. Such process is called a local oxidation of silicon process.

Figure 6:
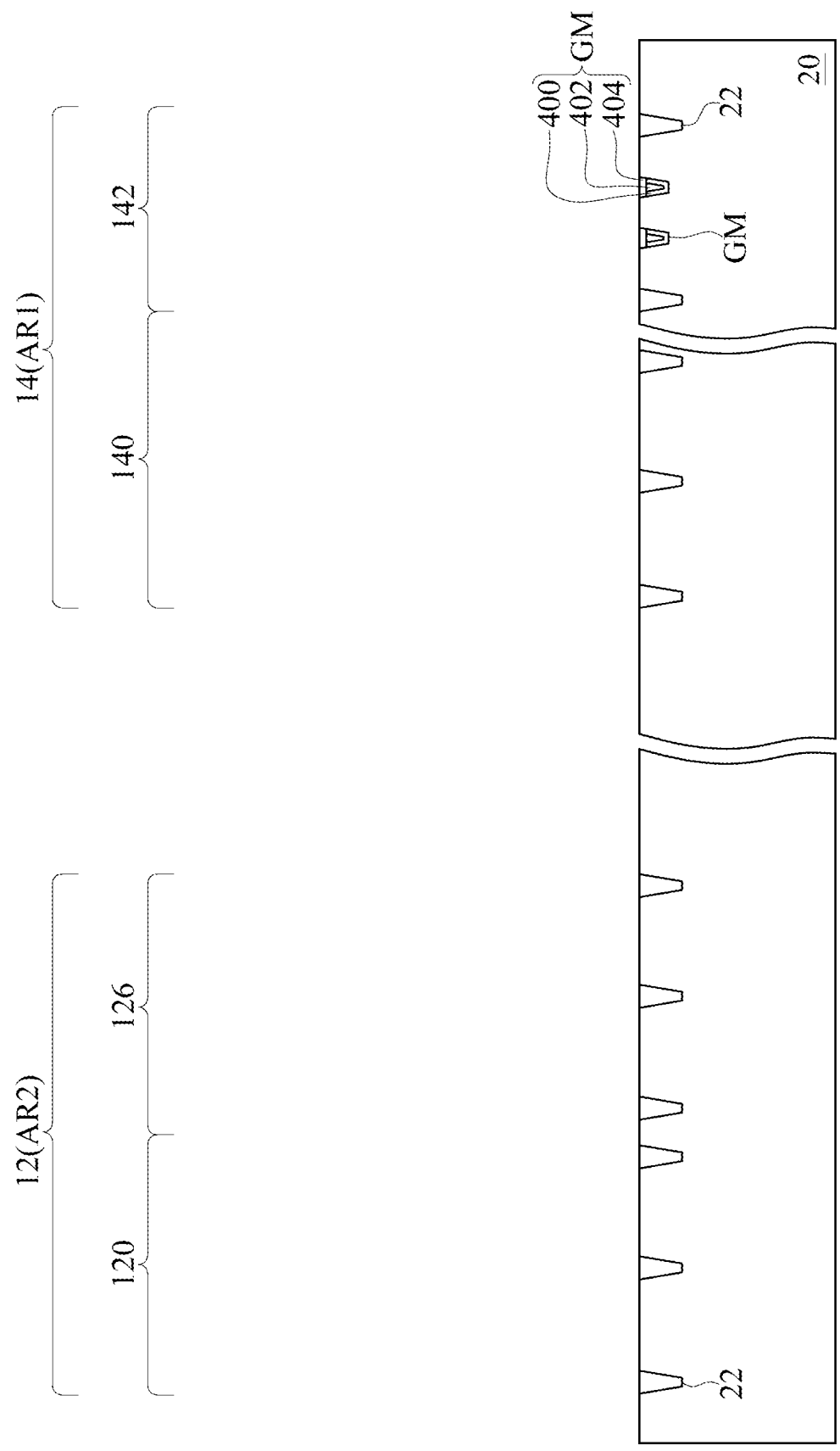

Referring to FIG. 6 and operation 502 in FIG. 3, the method 50 continues with operation 502, in which a memory gate is formed in or on the memory region. As depicted in FIG. 6, a plurality of memory gates GM are formed in the semiconductor substrate 20. In the present embodiment, the memory gate GM refers to a buried gate. The memory gate GM includes a gate insulating film 400, a conductive material 402, and a cap insulating film 404. In further detail, the gate insulating film 400 is formed in a groove provided in a surface region of the semiconductor substrate 20. The conductive material 402 is insulated by the gate insulating film 400 and the cap insulating film 404. However, the present disclosure is not limited thereto. The memory gate GM can include any form of buried gate.

Figure 7:
Figure 7:
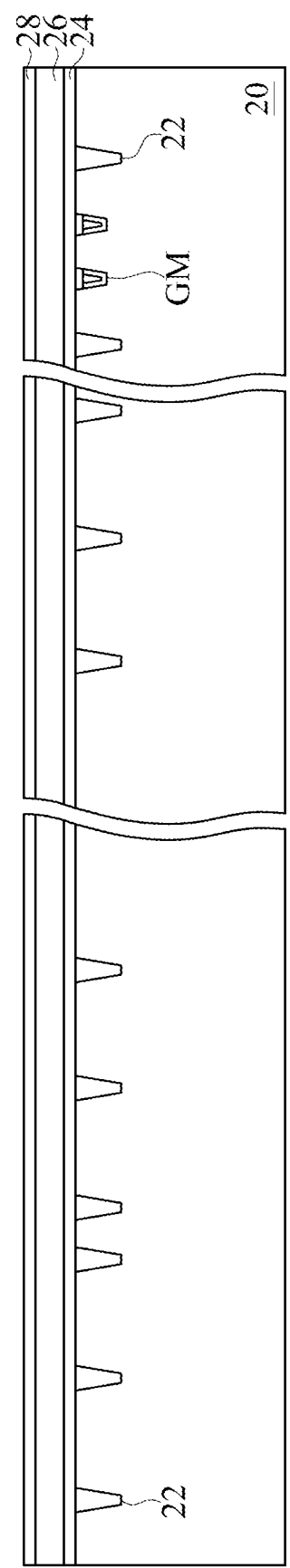
Figure 8:
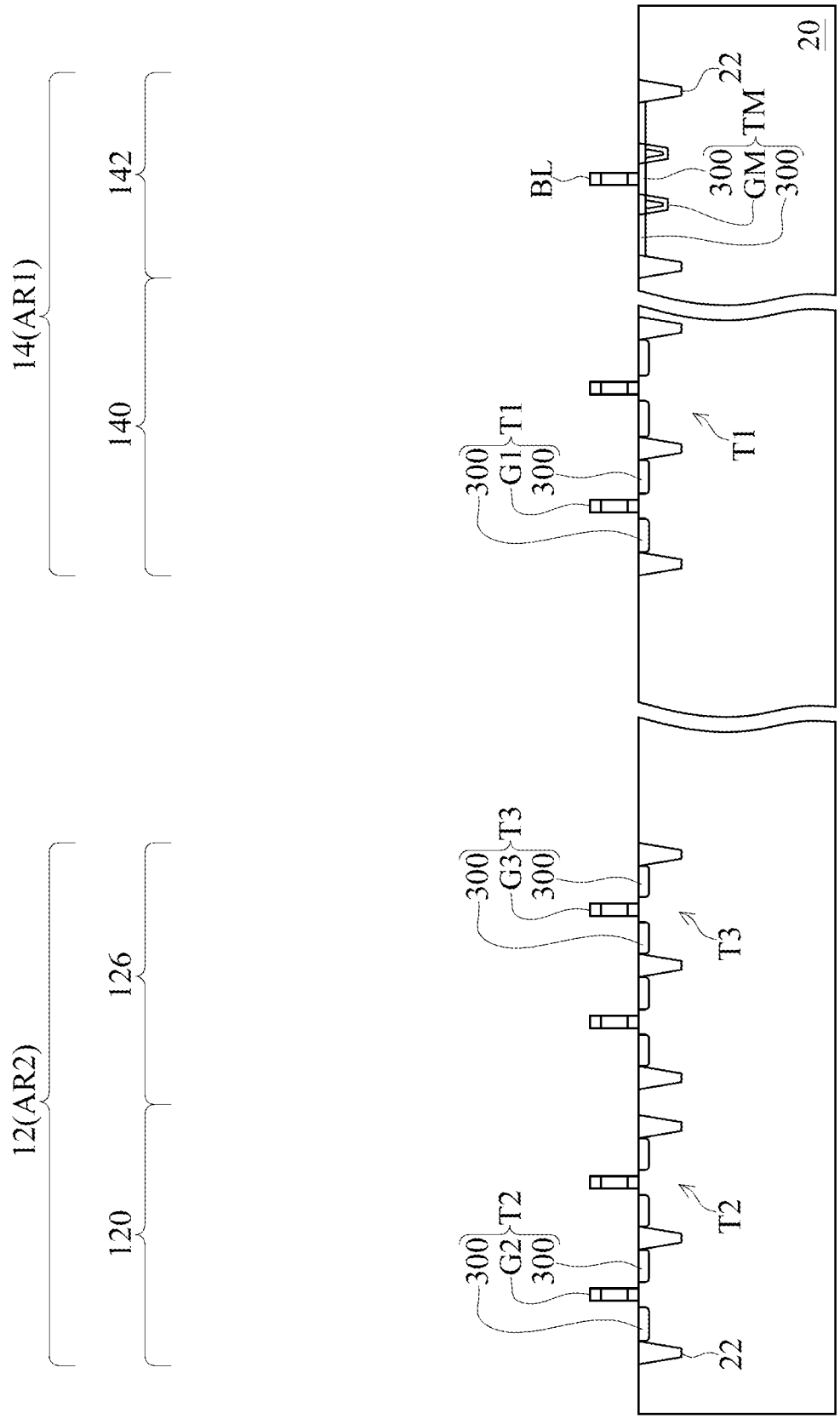

Referring to FIGS. 7 and 8 and operation 504 in FIG. 3, the method 50 continues with operation 504, in which a plurality of first poly-silicon gates are formed on the memory region and surround the memory gate. Moreover, the method 50 continues with operation 506, in which a plurality of second poly-silicon gates are formed on the logic region simultaneously with the formation of the first poly-silicon gates. As depicted in FIG. 7, a gate oxide layer 24 is formed on the semiconductor substrate 20 by, for example, a thermal oxidation. A poly-silicon layer 26 is formed on the gate oxide layer 24 by, for example, an LPCVD. In some embodiments, the poly-silicon layer 26 can be replaced with any suitable conductive layer. A tungsten silicide (WSi$_x$) layer 28 is formed on the poly-silicon layer 26 by, for example, an LPCVD.

Following the operation illustrated in FIG. 7, as depicted in FIG. 8, first logic gates G1, second logic gates G2, third logic gates G3 and a bit line BL are formed by performing an etch process to etch the gate oxide layer 24, the poly-silicon layer 26 and the WSi$_x$ layer 28 shown in FIG. 7. Moreover, the bit line BL is formed over the impurity diffusion region 300 adjacent to the memory gate GM. The bit line BL could refer to one of the bit lines BL1 to BLm shown in FIG. 1. The first logic gates G1, the second logic gates G2, the third logic gates, and the bit line BL are simultaneously formed.

In the present embodiment, the first logic gates G1 are level with the second logic gates G2, which are in turn level with the third logic gates G3, which are in turn level with the bit line BL. However, the present disclosure is not limited thereto. In some embodiments, the first logic gates G1, the second logic gates G2, the third logic gates G3 and the bit line BL are not formed at the same level on the substrate 20.

In the present embodiment, the first logic gates G1 are identical to the second logic gates G2, which are in turn identical to the third logic gates G3, which are in turn identical to the bit line BL. For example, the first logic gates G1, the second logic gates G2 and the third logic gates G3 include a poly-silicon gate. The bit line BL also has a poly-silicon structure. A portion of the first logic gates G1, a portion of the second logic gates G2, a portion of the third logic gates G3, and a portion of the bit line BL are in a patterned poly-silicon layer. However, the present disclosure is not limited thereto. In some embodiments, the first logic gates G1 may not be identical to the second logic gates G2, which in turn may not be identical to the third logic gates G3, which in turn may not be identical to the bit line BL.

It should be noted that in the present disclosure, the term "logic gate" does not refer to a logic gate used in a digital circuit, such as an AND logic gate, or an OR logic gate. The term "logic gate" used in the present disclosure serves instead to distinguish certain gates from the memory gate GM.

In some embodiments, an etch process includes an anisotropic etching such as dry etching, an isotropic etching such as wet etching, or a combination of anisotropic etching and isotropic etching. In some embodiments, the wet etching is carried out using a phosphoric acid as an etching solution. The anisotropic etching or the isotropic etching may be implemented by any known and suitable etching technique.

Referring to FIG. 8 and operation 508 in FIG. 3, the method 50 continues with operation 508, in which an impurity diffusion region is defined at sides of the first poly-silicon gates, the second poly-silicon gates and the memory gate in the semiconductor substrate. As depicted in FIG. 8, impurity diffusion regions 300 are defined in the semiconductor substrate 20 by, for example, implanting a dopant, such as phosphorus or arsenic, into a surface region of the semiconductor substrate 20, and on opposite sides of the corresponding gate by, for example, a self-alignment process. In further detail, phosphorus (P) is ion-implanted as an n-type impurity (i.e., a conductive impurity different from a p-type silicon substrate of the semiconductor substrate 20) into an entire top surface of the semiconductor substrate 20, under conditions, for example, in which energy is 100 KeV and a dose amount is 1E14 atoms/cm$^2$. The impurity diffusion region 300 serves as a drain region or a source region of a transistor, depending on a voltage applied.

The memory gate GM and the adjacent impurity diffusion regions 300 in combination define the memory transistor TM shown in FIG. 4. The memory gate GM can be deemed as a word line structure and serves as the word line WL shown in FIG. 4. The impurity diffusion region 300 between two memory gates GM serves as a drain region of both of the two memory transistors TM. As previously mentioned, in the present embodiment, the memory gate GM refers to a buried gate, and therefore the memory transistor TM accordingly includes a buried-gate transistor. In addition, for the sake of simplicity, in the following text and in the figures, only a few memory transistors TM are described and depicted in FIGS. 8 to 13.

Referring to FIG. 8, the first logic gate G1 and the adjacent impurity diffusion regions 300 in combination define a first logic transistor T1 of, for example, a sense amplifier of the MPC 140. In some embodiments, the first logic transistor T1 includes a complementary metal-oxide-semiconductor (CMOS) transistor. The MPC 140 includes a plurality of the first logic transistors T1. For the sake of simplicity, in the following text and in the figures, only a few first logic transistors T1 are described and depicted in FIGS. 8 to 13. Moreover, the first logic transistors T1 are disposed in the memory region AR1, and disposed adjacent to the memory transistors TM, in particular, with reference to FIGS. 2 and 8, surrounding the memory transistors TM.

Referring to FIG. 8, the second logic gate G2 and the adjacent impurity diffusion regions 300 in combination define a second logic transistor T2. In some embodiments, the second logic transistor T2 includes a CMOS transistor. The second logic transistor T2 is able to serve as a transistor of the CU 120, or the ALU 122. For convenience of description, in the present disclosure, the second logic transistor T2 serves as a transistor of the CU 120. The CU 120 includes a plurality of second logic transistors T2. For the sake of simplicity, in the following text and in the figures, only a few second logic transistors T2 are described and depicted in FIGS. 8 to 13. Moreover, the second logic transistors T2 are disposed in the logic region AR2. In further detail, the second logic transistor T2 is farther from the memory transistor TM than the first logic transistor T1.

Referring to FIG. 8, the third logic gate G3 and the adjacent impurity diffusion regions 300 in combination define a third logic transistor T3 of the PPC 126. In some embodiments, the third logic transistor T3 includes a CMOS transistor. The PPC 126 includes a plurality of third logic transistors T3. For the sake of simplicity, in the following text and in the figures, only a few third logic transistors T3 are described and depicted in FIGS. 8 to 13. The third logic transistors T3 are disposed in the logic region AR2, and disposed adjacent to the second logic transistors T2, in particular, with reference to FIGS. 2 and 8, surrounding the second logic transistors T2.

Referring to FIG. 8, in the present embodiment, the first logic transistor T1, the second logic transistor T2, and the third logic transistor T3 have the same semiconductor structure. However, the present disclosure is not limited thereto. In some embodiments, the first logic transistor T1, the second logic transistor T2, and the third logic transistor T3 may have different semiconductor structures. In further detail, in the present embodiment, the first logic transistor T1, the second logic transistor T2, and the third logic transistor T3 have the same semiconductor structure profile. However, the present disclosure is not limited thereto. In some embodiments, the first logic transistor T1, the second logic transistor T2, and the third logic transistor T3 may have different semiconductor structure profiles.

In the present embodiment, the first logic transistor T1, the second logic transistor T2, and the third logic transistor T3 have the same component. However, the present disclosure is not limited thereto. In some embodiments, the first logic transistor T1, the second logic transistor T2, and the third logic transistor T3 may have different components.

In the present embodiment, the component of the first logic transistor T1, the component of the second logic transistor T2, and the component of the third logic transistor T3 include the same semiconductor material. However, the present disclosure is not limited thereto. In some embodiments, the component of the first logic transistor T1, the component of the second logic transistor T2, and the component of the third logic transistor T3 may have different semiconductor materials.

In the present embodiment, the first logic transistor T1 is level with the second logic transistor T2, which in turn is level with the third logic transistor T3. However, the present disclosure is not limited thereto. In some embodiments, the first logic transistor T1, the second logic transistor T2 and the third logic transistor T3 are not disposed at the same level on and in the substrate 20.

Referring to FIGS. 2 and 8, the guard ring 16 surrounds the DRAM 14 and the processing unit 12, and the guard ring 16 accordingly surrounds the memory transistors TM, the first logic transistors T1, the second logic transistors T2, and the third logic transistors T3. The memory transistor TM is disposed between the second logic transistor T2 and the guard ring 16.

Figure 9:
Figure 9:
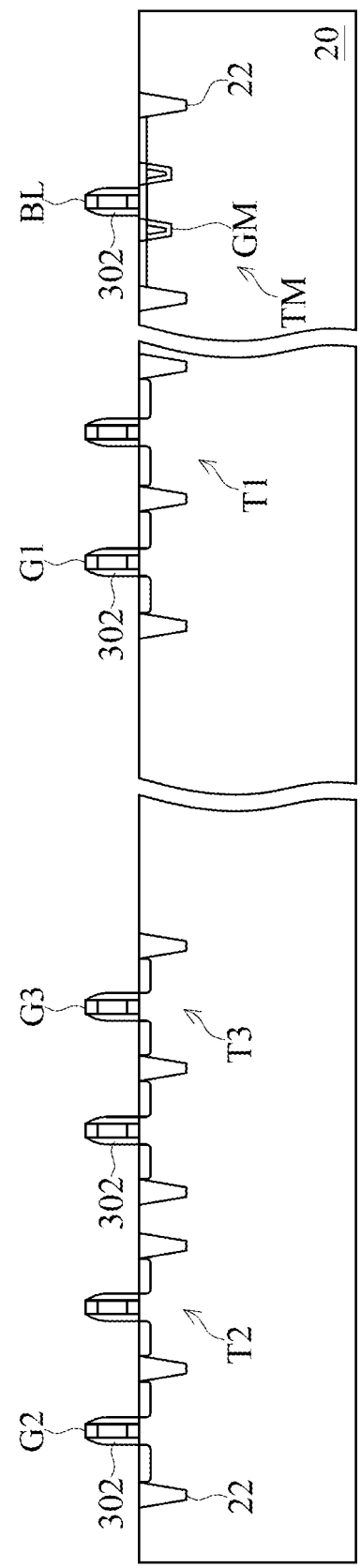

Referring to FIG. 9, a spacer 302 is formed at opposite sides of the first logic gates G1, the second logic gates G2, the third logic gates G3 and the bit line BL to cover a side surface of the corresponding gate and the corresponding bit line by, for example, deposition of an oxide layer on the semiconductor substrate 20, followed by an anisotropic etch. In some embodiments, a lightly doped drain/source region can be defined in the semiconductor substrate 20 prior to the formation of the spacer 302.

Figure 10:
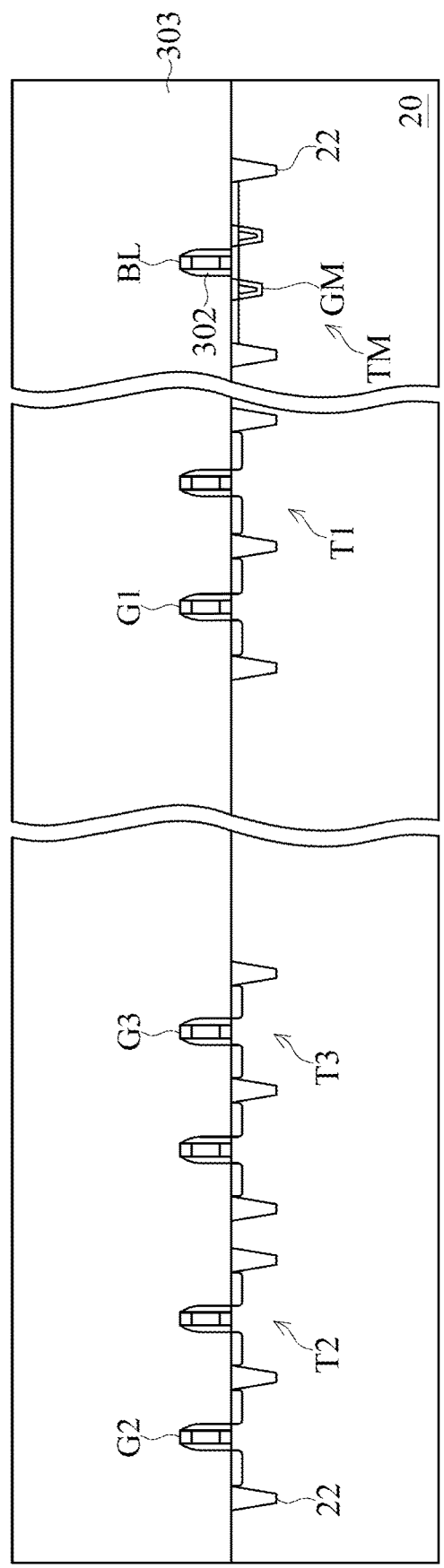
Figure 11:
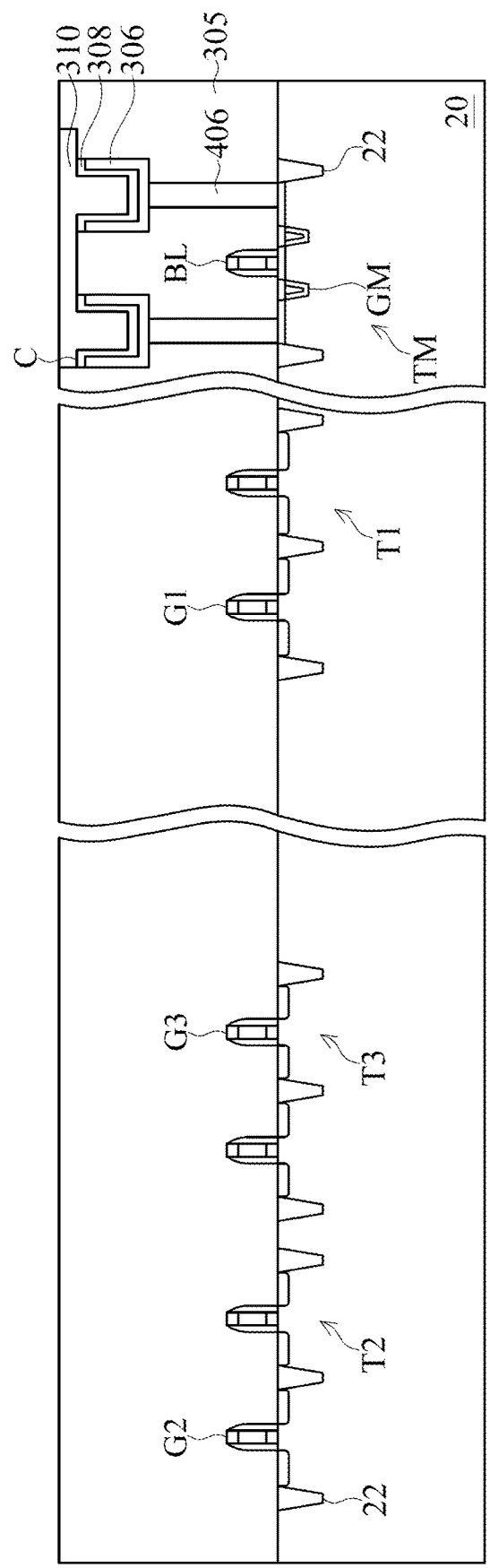

Referring to FIGS. 10 to 11 and operation 510 in FIG. 3, the method 50 continues with operation 510, in which an oxide-layer-based storage structure is formed on the impurity diffusion region adjacent to the memory gate. As depicted in FIG. 10, a dielectric layer 303 is formed on the semiconductor substrate 20 and covers the first logic gates G1, the second logic gates G2, the third logic gates G3 and the bit line BL by, for example, an atmospheric pressure chemical vapor deposition (APCVD). After the formation of the dielectric layer 303, the memory gate GM is disposed beneath the dielectric layer 303, and the first logic gate G1, the second logic gate G2, the third logic gate G3 and the bit line BL are disposed in the dielectric layer 303. The dielectric layer 303 is made of a silicon oxide film or the like. An upper surface of the dielectric layer 303 is polished and planarized by a chemical mechanical polishing (CMP) method. The dielectric layer 303 serves as an inter-layer dielectric layer (ILD1).

In addition, following the operation illustrated in FIG. 10, as depicted in FIG. 11, a patterned dielectric layer 305 is formed by performing a photolithography process followed by an etch process on the dielectric layer 303 shown in FIG. 10. A capacitor contact 406 is formed in the patterned dielectric layer 305. A capacitor C is formed in the patterned dielectric layer 305, and is coupled to the impurity diffusion region 300 via the capacitor contact 406. The capacitor C includes a polysilicon layer 306, a dielectric layer 308 and a polysilicon layer 310.

For example, the polysilicon layer 306 is formed in capacitor holes in the patterned dielectric layer 305 by, for example, a deposition process followed by a photolithography process and then by an etch process. In some embodiments, the polysilicon layer 306 can be replaced with any suitable conductive layer. The polysilicon layer 306 serves as a storage node.

The dielectric layer 308 is formed on the polysilicon layer 306 by, for example, a deposition process. In some embodiments, the dielectric layer 308 includes three stacked dielectric layers, i.e., a $SiO_2$ layer, a $Si_3N_4$ layer and a $SiO_2$ layer, which combine to form an O—N—O structure.

The polysilicon layer 310 is formed on the dielectric layer 308 by, for example, a deposition process followed by a photolithography process and then by an etch process. In some embodiments, the polysilicon layer 310 can be replaced with any suitable conductive layer. However, the present disclosure is not limited thereto. The capacitor C may include any form of cell capacitor.

Figure 12:
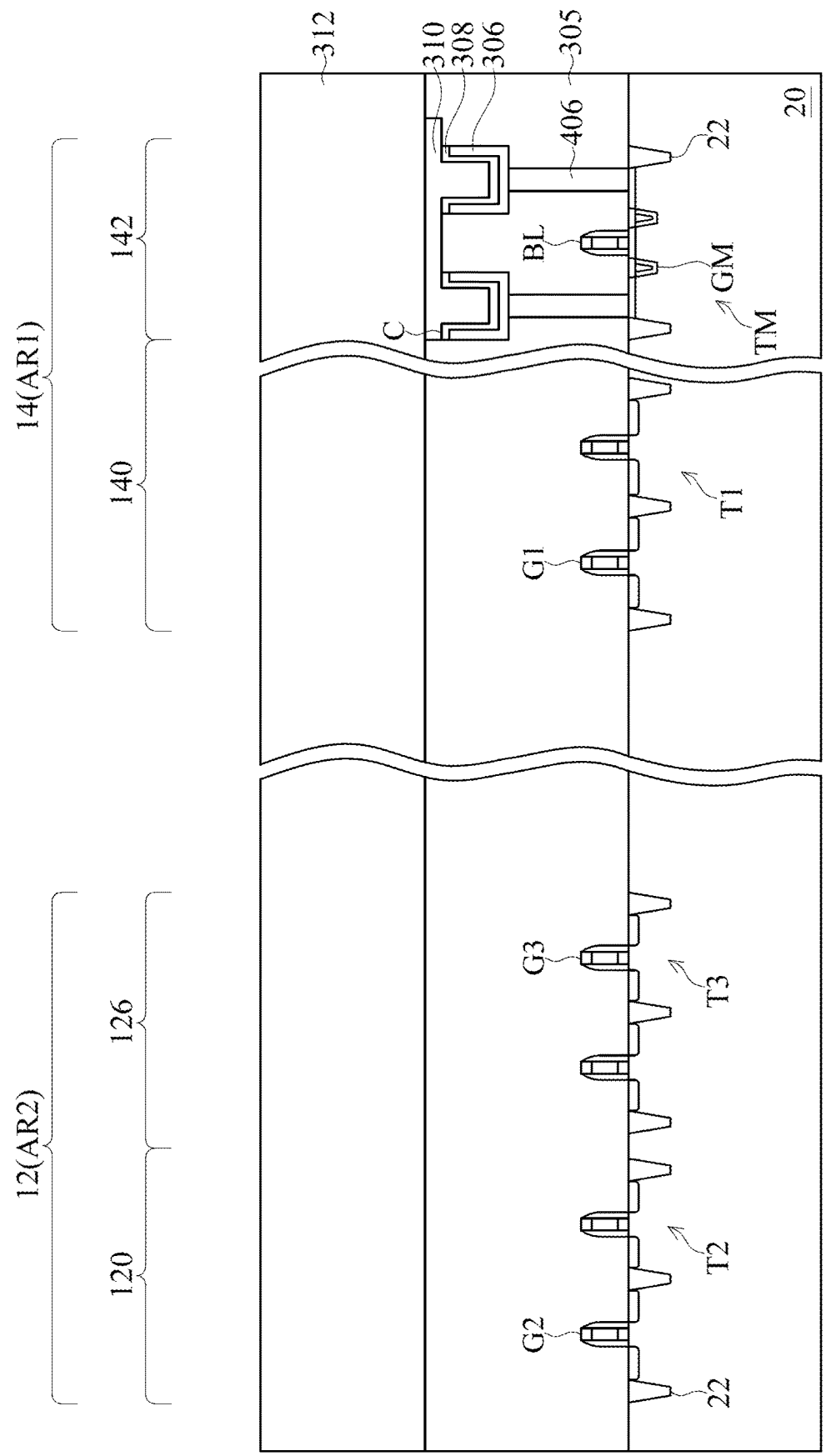

Referring to FIG. 12, a dielectric layer 312 is formed on the patterned dielectric layer 305 by, for example, an atmospheric pressure chemical vapor deposition (APCVD) process. The dielectric layer 312 serves as another inter-layer dielectric layer (ILD2).

Figure 13:
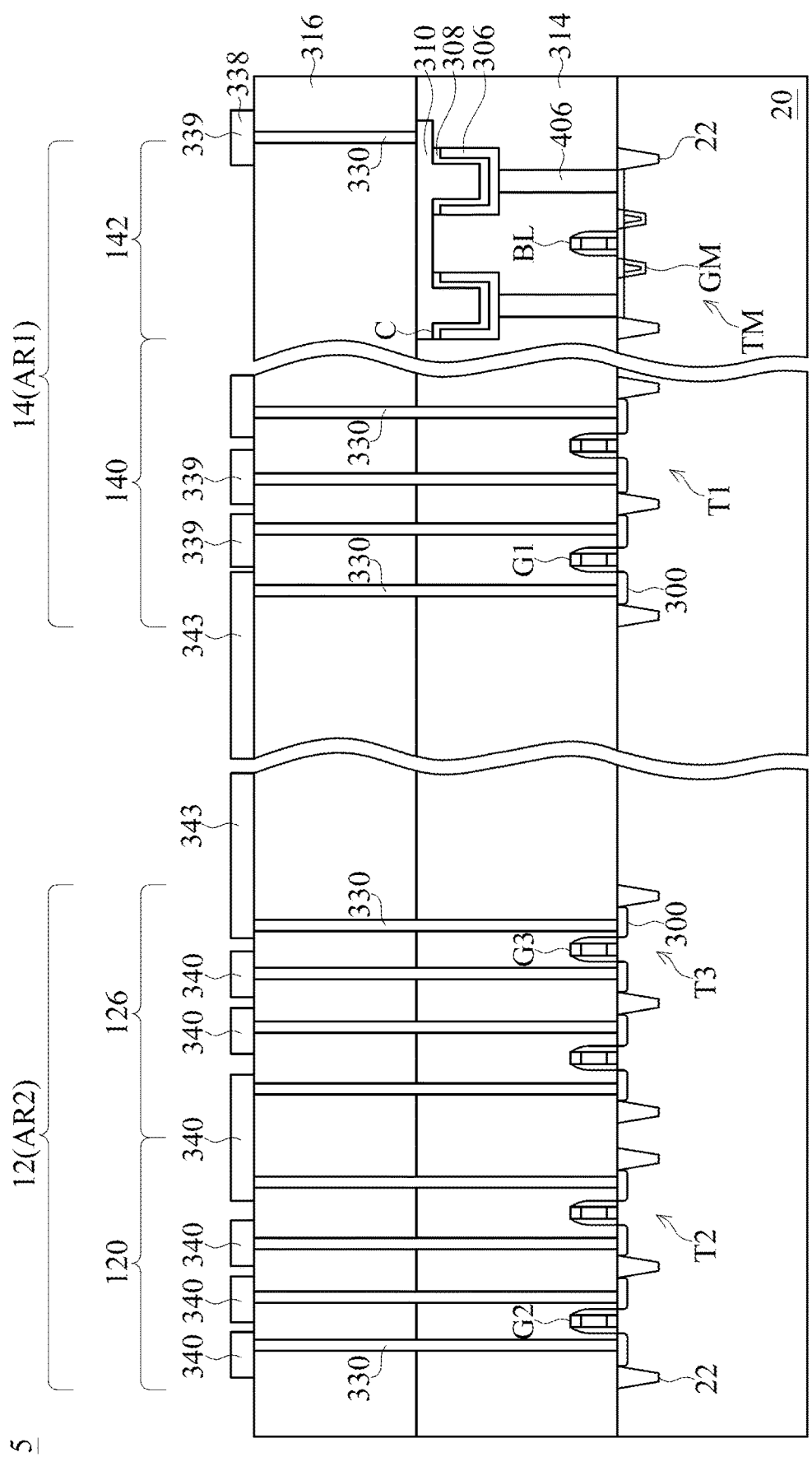

In addition, following the operation shown in FIG. 12, as depicted in FIG. 13, the patterned dielectric layers 314 and 316 are formed by performing a photolithography process followed by an etch process on the patterned dielectric layer 305 and the dielectric layer 312 shown in FIG. 12.

Moreover, referring to FIG. 13 and operation 514 in FIG. 3, the method 50 continues with operation 514, in which a patterned conductive layer is formed above the semiconductor substrate. The patterned conductive layer includes a first conductive portion, a second conductive portion, and a third conductive portion. The first conductive portion is formed in alignment with the impurity diffusion regions adjacent to the memory gate and the first poly-silicon gates. The second conductive portion is formed in alignment with the impurity diffusion regions adjacent to the second poly-silicon gates and the third poly-silicon gates. The third conductive portion is formed in alignment with the impurity diffusion regions adjacent to the third poly-silicon gates and the first poly-silicon gates.

Plugs 330 are formed in contact holes of the patterned dielectric layers 314 and 316. A patterned conductive layer 338 for electrical connection is formed by, for example, a metallization process. The patterned conductive layer 338 includes, for example, a metal-1 (M1) layer. However, the present disclosure is not limited thereto.

The patterned conductive layer 338 extends above the semiconductor substrate 20, and extends over the memory region AR1 and the logic region AR2. The patterned conductive layer 338 includes conductive portions 339, 340 and 343.

The conductive portion 339 is defined in alignment with the memory region AR1. Accordingly, the conductive portion 339 extends over the memory region AR1, and is free of extending over the logic region AR2. The conductive portion 339 is electrically coupled to the polysilicon layer 310, and then to the impurity diffusion region 300. In summary, the conductive portion 339 is configured for internal electrical connection to the DRAM 14, and is free of internal electrical connection to the processing unit 12.

The conductive portion 340 is defined in alignment with the logic region AR2. Accordingly, the conductive portion 340 extends over the logic region AR2, and is free of extending over the memory region AR1. The conductive portion 340 is electrically coupled to the impurity diffusion regions 300 of the second logic transistor T2 and the third logic transistor T3 via the plug 330. In summary, the conductive portion 340 is configured for internal electrical connection to the processing unit 12, and is free of internal electrical connection to the DRAM 14.

The conductive portion 343 is defined as extending across the memory region AR1 and the logic region AR2. Accordingly, the conductive portion 343 extends from a location over the memory region AR1 to a location over the logic region AR2. The conductive portion 343 is coupled to the impurity diffusion region 300 of the third logic transistor T3 via the plug 330 at its one end, and is coupled to the impurity diffusion region 300 of the first logic transistor T1 via the plug 330 at its the other end.

To facilitate the better understanding of operation of the semiconductor device 5, referring to both FIGS. 1 and 13, in operation, for example, the second logic transistor T2 of the CU 120 (for example, in accompaniment with transistors of the ALU 122) generates a memory control signal Control. The memory control signal Control is transmitted from the second logic transistor T2 to the third logic transistor T3 of the PPC 126 via the conductive portion 340. The third logic transistor T3 of the PPC 126 may process the memory control signal Control, and then transmits the memory control signal Control to the first logic transistor T1 of the MPC 140 via the conductive portion 343. The first logic transistor T1, for example, converts the memory control signal Control into a word line selection signal and a bit line selection signal, which are then transmitted to the memory transistor TM of the memory cell array 142 via the conductive portion 339, thereby controlling the memory cell array 142. In summary, the patterned conductive layer 388 functions to, for example, transmit a memory control signal Control, a word line select signal and a bit line select signal.

In some embodiments, as shown in FIG. 2, a guard ring is formed on the semiconductor substrate and surrounds the memory gate, the first poly-silicon gates, the second polysilicon gates and the third poly-silicon gates.

The structure and manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to discern the differences between the embodiments, the following description will detail the dissimilarities among different embodiments and the identical features will not be redundantly described.

The method 50 is merely an example, and is not intended to limit the present disclosure beyond what is explicitly recited in the claims. Additional operations can be provided before, during, and after the method 50, and some operations described can be replaced, eliminated, or moved around for additional embodiments of the method. An order of the operations 500 to 514 shown in FIG. 3 is not intended to limit an order in performing operations 500 to 514.

A foundry that focuses on DRAM fabrication would typically be familiar with factors relating to simultaneous fabrication of both a memory product (i.e., the memory cell array 142) and a logic circuit (i.e., the MPC 140). The processing unit 12 is also a logic circuit. Therefore, in the present embodiments, the processing unit 12 and the DRAM 14 are manufactured by a complementary metal-oxide-semiconductor (CMOS) fabrication process. Such CMOS fabrication process is identical to the process currently adopted in existing foundries to fabricate a DRAM. Thus, the existing process flow can still be followed, and there is no need to develop an entirely new fabrication process.

Under such integration, some of the memory spaces previously provided by the SRAM 124 would be assumed by the DRAM 14, and therefore memory space of the SRAM 124 could be reduced. As a result, a memory density would be relatively high, compared to an existing processing unit that is not fabricated with a DRAM on the same semiconductor substrate.

Moreover, data exchange between the processing unit 12 and the DRAM 14 occurs within the semiconductor device 5. Data exchange with an object external to the semiconductor device 5 is eliminated, or significantly reduced.

In addition, since the processing unit 12 and the DRAM 14 are produced on the same single semiconductor substrate 20, only one chip is produced. No system in package (SiP) is required to stack the processing unit 12 on the DRAM 14. As a result, complexity in design, process and variation can be significantly decreased.

Figure 14:
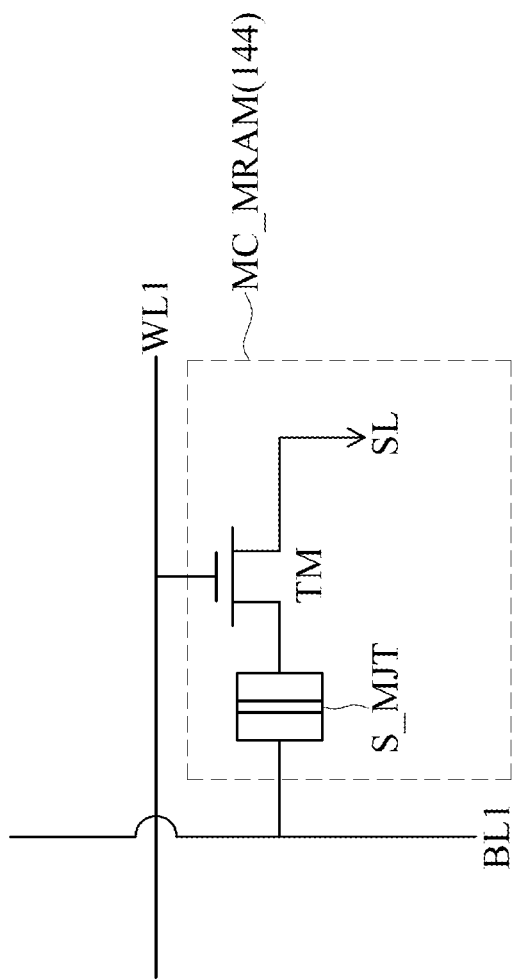
FIG. 14 is a circuit diagram of the memory cell shown in FIG. 1 in an embodiment wherein the semiconductor memory shown in FIG. 1 is a magnetoresistive random access memory (MRAM), in accordance with some embodiments of the present disclosure.

FIG. 14 is a circuit diagram of the memory cell 144 shown in FIG. 1 in an embodiment wherein the semiconductor memory 14 shown in FIG. 1 is an MRAM, in accordance with some embodiments of the present disclosure. For brevity, only one memory cell 144 is illustrated and depicted.

Referring to FIG. 14, the memory cell 144 can be indicated by MC_MRAM. The memory cell 144 includes a memory transistor TM and a magnetic tunneling junction (MJT) transistor S_MJT.

A drain of the memory transistor TM is coupled to one end of the MJT transistor S_MJT, and a source of the memory transistor TM is coupled to a source line SL. The other end of the MJT transistor S_MJT is coupled to the bit line BL1. The MJT transistor S_MJT serves as a storage device for storing data, similar to the capacitor C in the DRAM 14.

FIGS. 15 to 18 are cross-sectional views illustrating intermediate stages of fabrication of a semiconductor device 5 including an MRAM taken along a line A-A shown in FIG. 2, in accordance with some embodiments of the present disclosure.

A semiconductor process of manufacturing the semiconductor device 5 including the MRAM is similar to that of manufacturing the semiconductor device 5 including the DRAM as shown and described with reference to FIGS. 5 to 13. As such, some descriptions with regard to similar processes are omitted herein.

Figure 15:
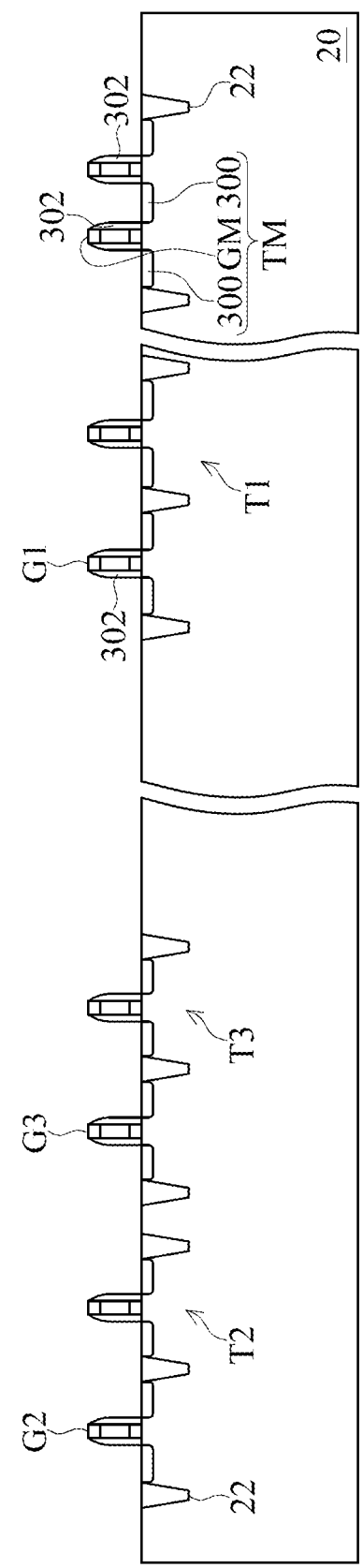
FIGS. 15 to 18 are cross-sectional views illustrating intermediate stages of fabrication of a semiconductor device including an MRAM taken along a line A-A shown in FIG. 2, in accordance with some embodiments of the present disclosure.

Referring to FIG. 15 and operations 502, 504, 506 and 508 in FIG. 3, a memory transistor TM, a first logic transistor T1, a second logic transistor T2 and a third logic transistor T3 are formed simultaneously. In further detail, the first logic transistor T1, the second logic transistor T2 and the third logic transistor T3 are formed in accordance with the semiconductor process shown in FIGS. 7 to 9. In addition, the formation of the memory transistor TM also follows the semiconductor process shown in FIGS. 7 to 9.

The memory transistor TM includes a CMOS transistor, the first logic transistor T1 includes a CMOS transistor, the second logic transistor T2 includes a CMOS transistor, and the third logic transistor T3 includes a CMOS transistor.

Referring to FIG. 15, in the present embodiment, the memory transistor TM, the first logic transistor T1, the second logic transistor T2, and the third logic transistor T3 have the same semiconductor structure. However, the present disclosure is not limited thereto. In some embodiments, the memory transistor TM, the first logic transistor T1, the second logic transistor T2, and the third logic transistor T3 may have different semiconductor structures. In further detail, in the present disclosure, the memory transistor TM, the first logic transistor T1, the second logic transistor T2, and the third logic transistor T3 have the same semiconductor structure profile. However, the present disclosure is not limited thereto. In some embodiments, the memory transistor TM, the first logic transistor T1, the second logic transistor T2, and the third logic transistor T3 may have different semiconductor structure profiles.

In the present embodiment, the memory transistor TM, the first logic transistor T1, the second logic transistor T2, and the third logic transistor T3 have the same component. However, the present disclosure is not limited thereto. In some embodiments, the memory transistor TM, the first logic transistor T1, the second logic transistor T2, and the third logic transistor T3 may have different components.

In the present embodiment, the component of the memory transistor TM, the component of the first logic transistor T1, the component of the second logic transistor T2, and the component of the third logic transistor T3 include the same semiconductor material. However, the present disclosure is not limited thereto. In some embodiments, the component of the memory transistor TM, the component of the first logic transistor T1, the component of the second logic transistor T2, and the component of the third logic transistor T3 include different semiconductor materials.

In the present embodiment, the memory transistor TM is level with the first logic transistor T1, the first logic transistor T1 is level with the second logic transistor T2, and the second logic transistor T2 is level with the third logic transistor T3. However, the present disclosure is not limited thereto. In some embodiments, the memory transistor TM, the first logic transistor T1, the second logic transistor T2, and the third logic transistor T3 are not disposed at the same level on and in the substrate 20.

Figure 16:
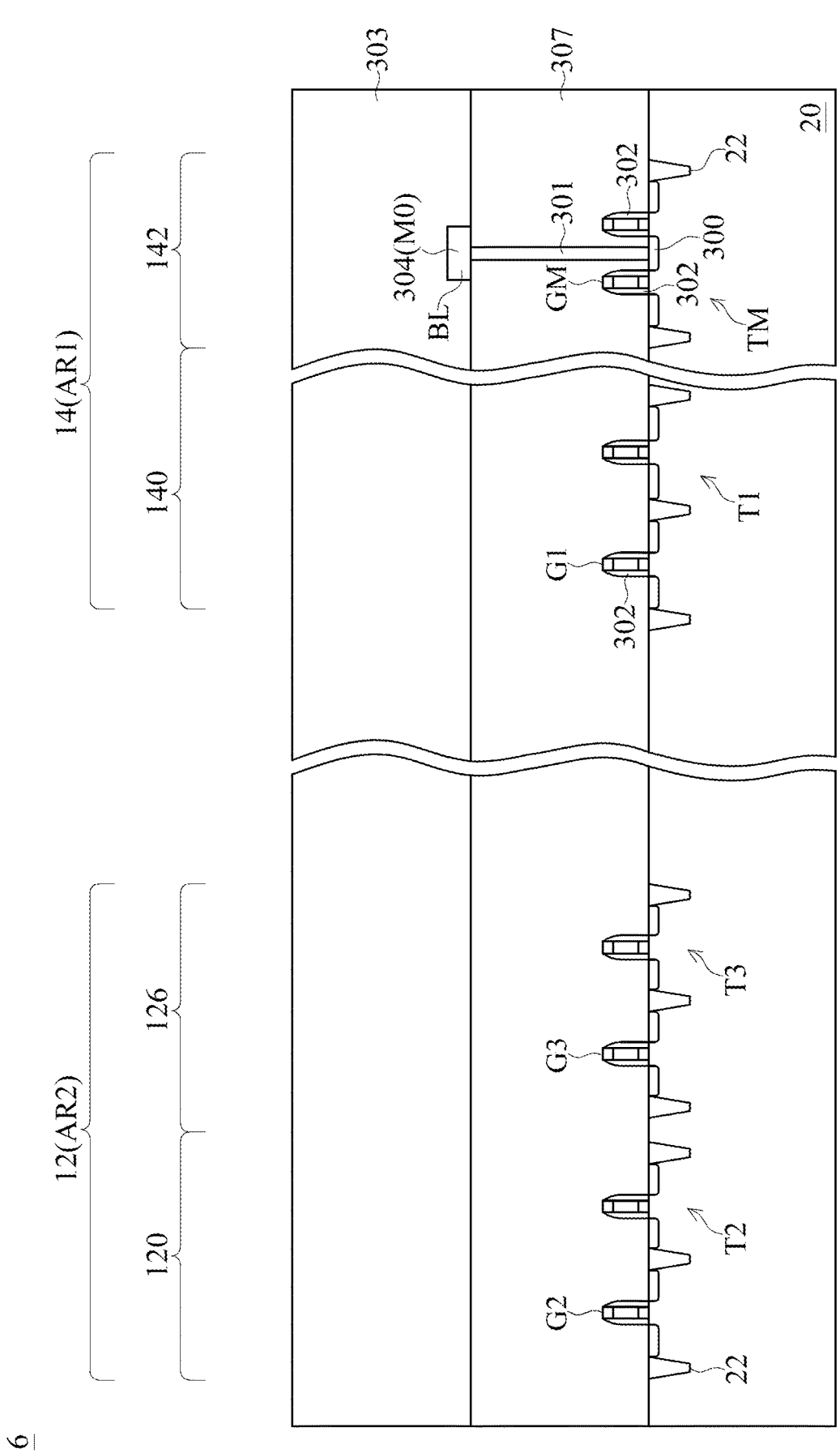
Figure 17:
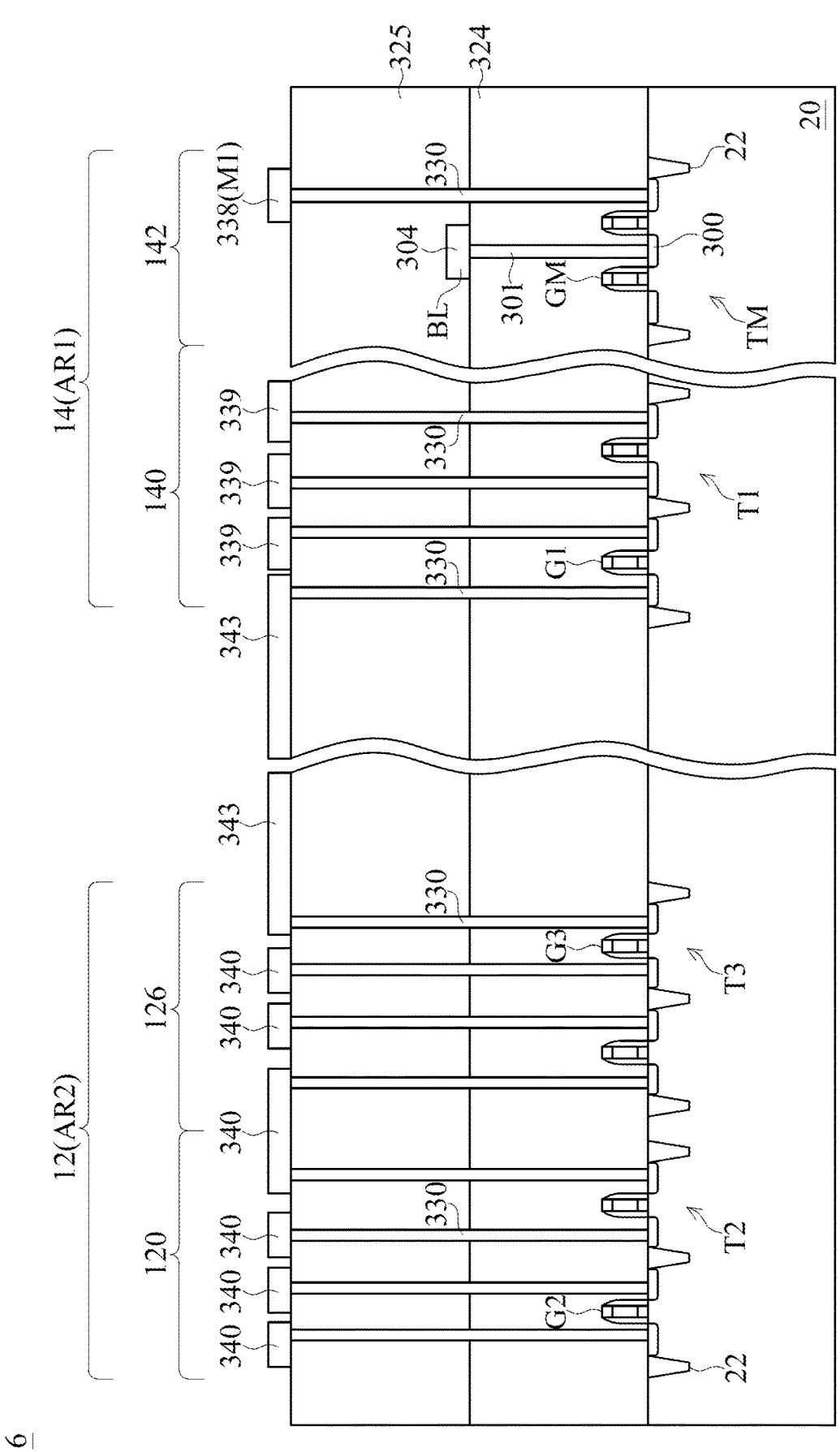

Referring to FIGS. 16 to 17 and operation 514 in FIG. 3, a patterned dielectric layer 307 is formed on the substrate 20 and covers the memory gate GM, the first logic gate G1, the second logic gate G2 and the third logic gate G3. In addition, a contact 301 is formed in the patterned dielectric layer 307 and on the corresponding impurity diffusion region 300. A bit line BL is formed in a conductive layer 304 and on the contact 301. In some embodiments, the conductive layer 304 is a metal-0 (M0) layer. A dielectric layer 303 is formed on the patterned dielectric layer 307 and on the bit line BL.

Referring to FIG. 17, a patterned dielectric layer 324 and a patterned conductive layer 325 are formed by patterning the patterned dielectric layer 307 and the dielectric layer 303, respectively, shown in FIG. 16.

Plugs 330 are formed in the patterned dielectric layer 324 and the patterned conductive layer 325, and on the corresponding impurity diffusion region 300. A patterned conductive layer 338 for electrical connection is formed on the patterned dielectric layer 324.

Figure 18:
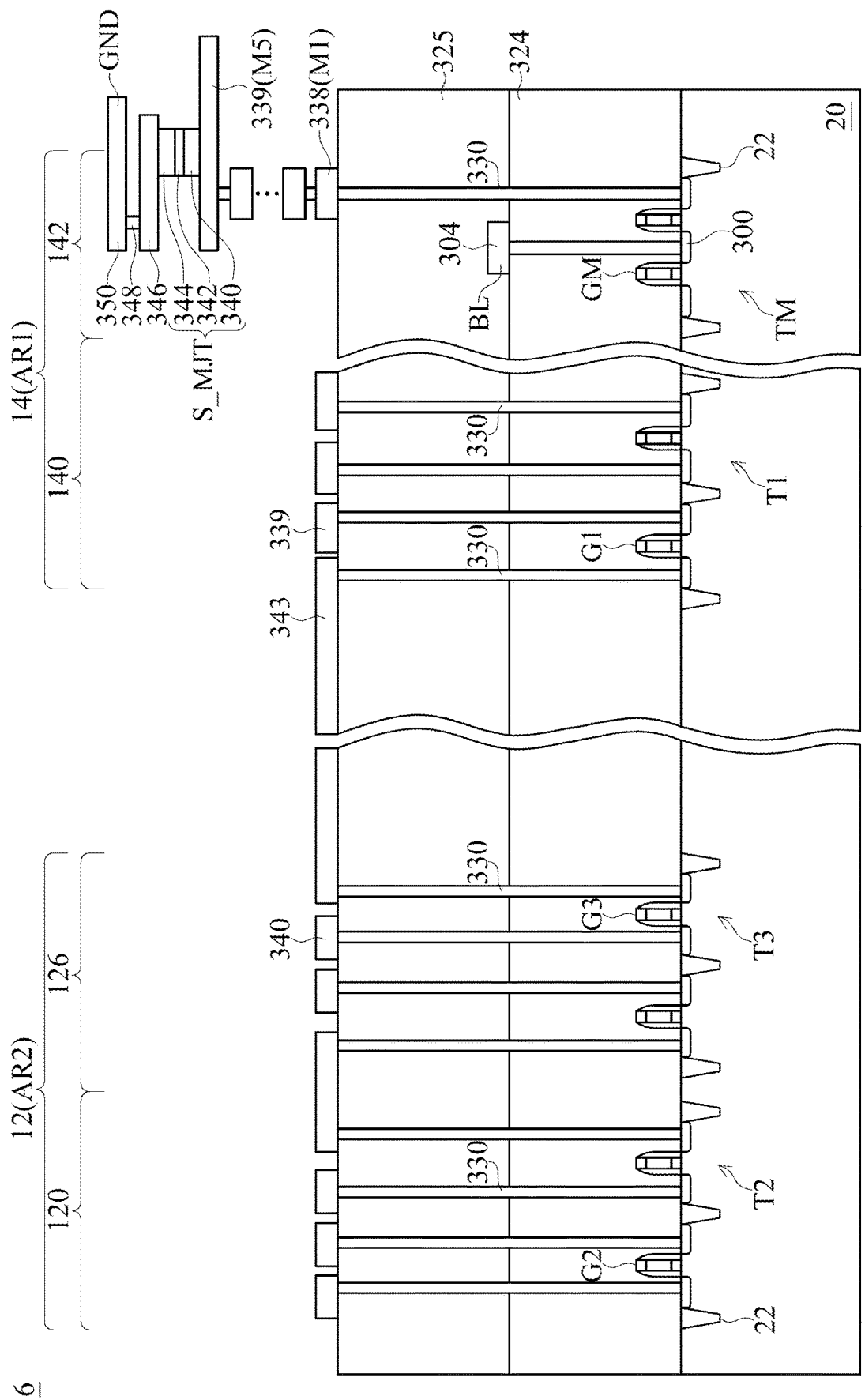

Referring to FIG. 18, a plurality of conductive layers, a plurality of plugs and a plurality of dielectric layers are formed in accordance with the method of forming the patterned conductive layer 338, plugs 330 and the patterned dielectric layer 324. Such processes are repeatedly performed until a patterned conductive layer 339 is formed. In the present disclosure, the patterned conductive layer 339 is a metal-5 (M5) layer. The MJT transistor S_MJT is formed on the patterned conductive layer 339. The MJT transistor S_MJT includes a reference layer 340, an oxide barrier layer 342, and a free layer 344. The free layer 344 is formed on the oxide barrier layer 342, which is in turn formed on the reference layer 340. As such, the MJT transistor S_MJT includes an oxide-layer-based storage structure.

A conductive layer 346 is formed on the free layer 344. Next, a via 348 is formed on the conductive layer 346. Subsequently, a source line 350 is formed, and the source line 350 is coupled to the MJT transistor S_MJT. In addition, the source line 350 is coupled to a reference ground GND.

It should be noted that FIG. 18 illustrates an embodiment of the semiconductor device 6 including a spin-torque-transfer (STT) MRAM. However, the present disclosure is not limited thereto. In some embodiments, the semiconductor device 6 includes other suitable types of MRAM, such as a pSTT MRAM.

Figure 19:
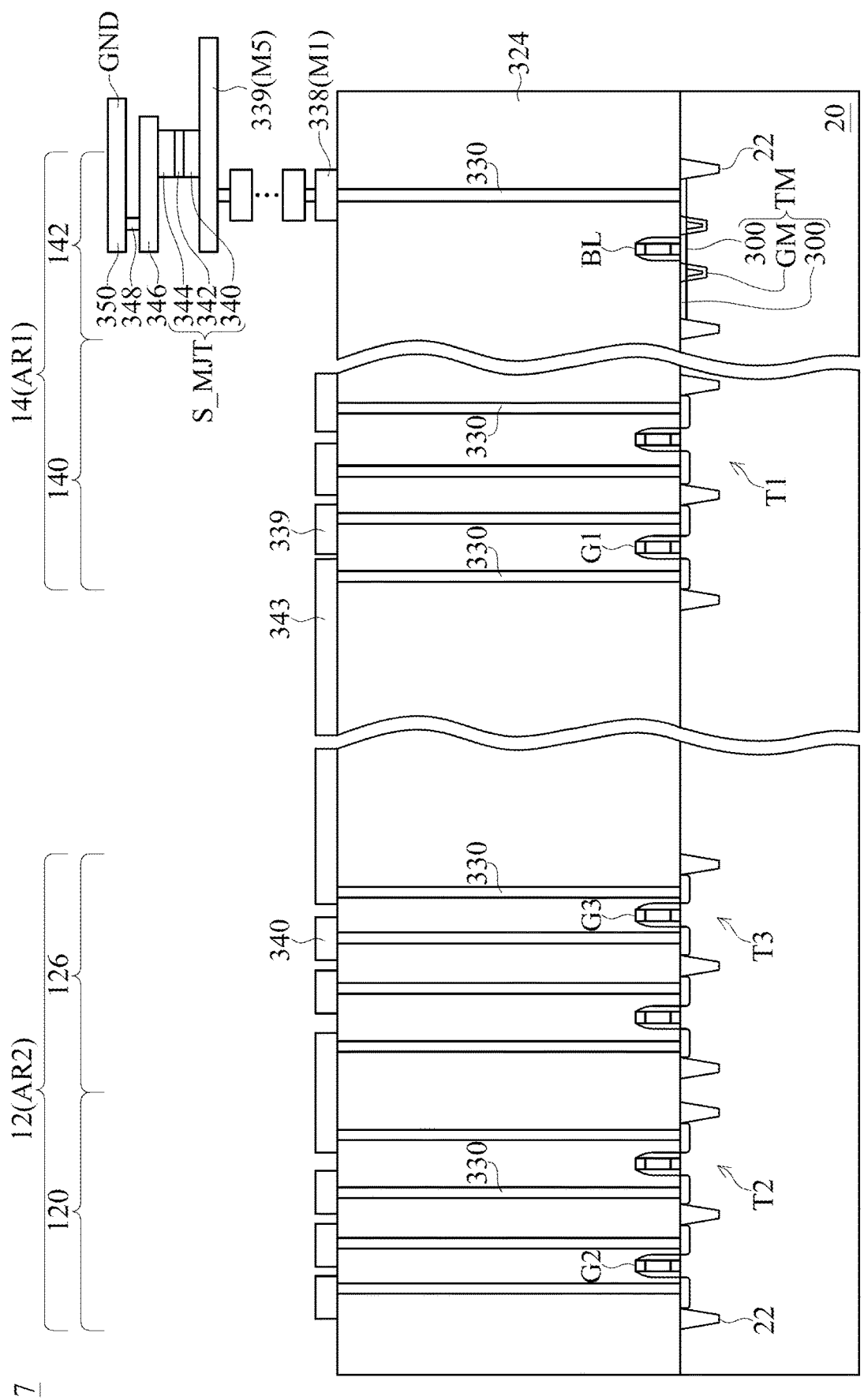
FIG. 19 is a cross-sectional view of another semiconductor device, in accordance with some embodiments of the present disclosure.

FIG. 19 is a cross-sectional view of another semiconductor device 7, in accordance with some embodiments of the present disclosure. Referring to FIG. 19, the semiconductor device 7 is similar to the semiconductor device 6 described and illustrated with reference to FIG. 18 except that, for example, the semiconductor device 7 includes a buried-gate transistor and a bit line BL as shown in FIG. 13. As such, the detailed descriptions are omitted herein.

Figure 20:
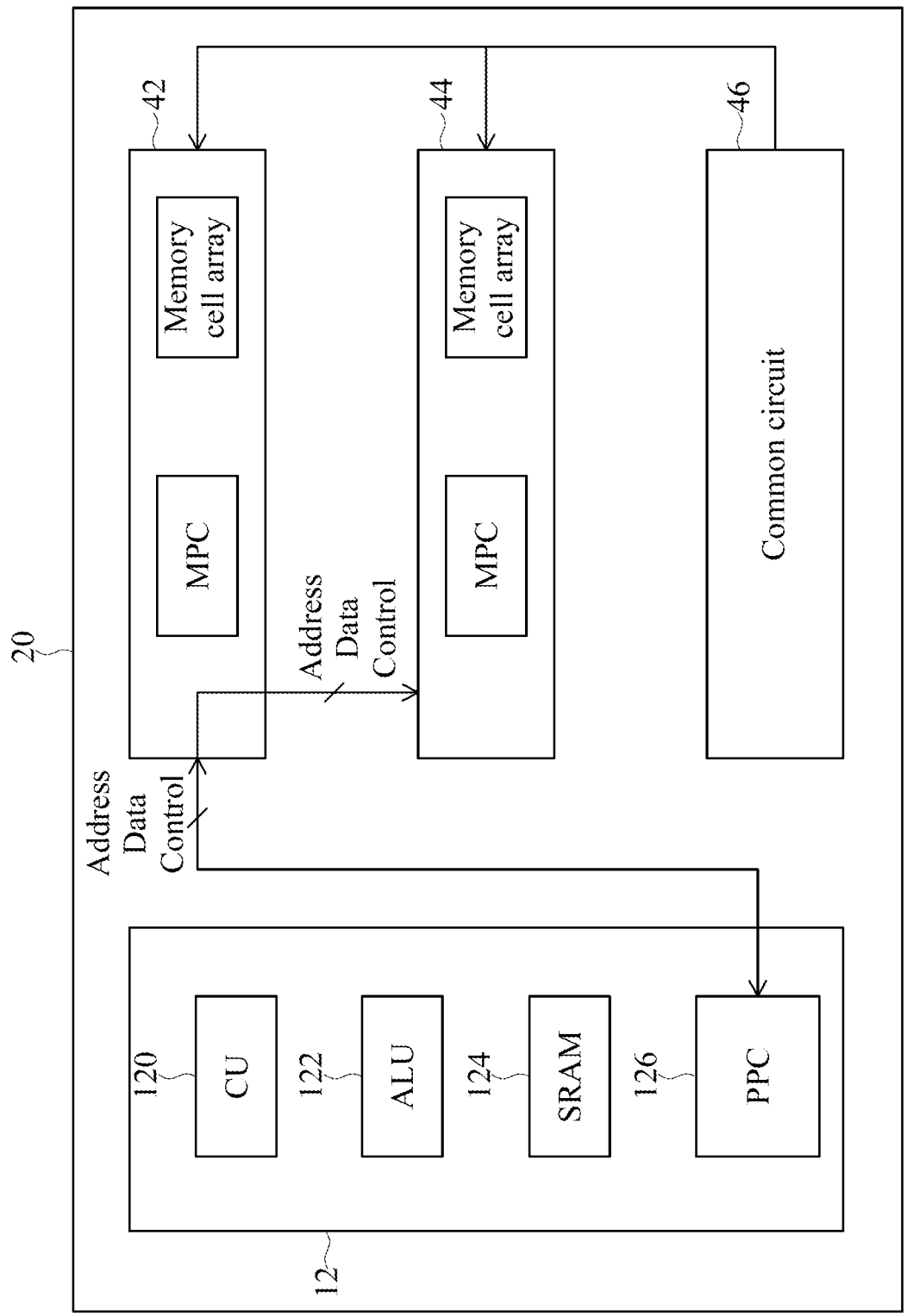
FIG. 20 is a schematic diagram of another semiconductor device, in accordance with some embodiments of the present disclosure.

FIG. 20 is a schematic diagram of another semiconductor device 40, in accordance with some embodiments of the present disclosure. Referring to FIG. 20, the semiconductor device 40 is similar to the semiconductor device 5 described and illustrated with reference to FIG. 1 except that, for example, the semiconductor device 40 further includes a first semiconductor memory 42, a second semiconductor memory 44, and a common circuit 46.

The first semiconductor memory 42 is similar to the second semiconductor memory 44, and further similar to the semiconductor memory 14 shown in FIG. 1, except that data latency of the first semiconductor memory 42 is less than or equal to that of the second semiconductor memory 44, and data density of the first semiconductor memory 42 is less than or equal to that of the second semiconductor memory 44. Further, both data latency and data density of the SRAM 124 are less than or equal to those of the first semiconductor memory 42.

In some embodiments, the common circuit 46 includes common circuits between the first semiconductor memory 42 and the second semiconductor memory 44. For example, the common circuit 46 includes a direct-current (DC) generator, or a phase-locked loop (PLL). However, the present disclosure is not limited thereto. In some embodiments, the common circuit 46 includes other circuits common to the first semiconductor memory 42 and the second semiconductor memory 44.

In some embodiments, the semiconductor device 40 communicates with integrated circuits external to the semiconductor device 40 via an interface. The interface includes one of a wired interface and a wireless interface. In some embodiments, the one of the wired interface and the wireless interface comprises one of a peripheral component interconnect express (PCIe), an NVLlink, a universal flash storage (UFS), an eMMC, an inter-integrated circuit (I2C), a qi interface, a double data rate direction register (DDRx), an LPDDRx, an HBMx, and a WIOx protocol. However, the present disclosure is not limited thereto. In some embodiments, the interface includes other suitable types of I/O circuits.

In the present embodiment, a quantity of semiconductor memories is two, i.e., the first semiconductor memory 42 and the second semiconductor memory 44. However, the present disclosure does not limit the quantity of semiconductor memories to 2. In other embodiments, the semiconductor device 40 may include a quantity of semiconductor memories greater than two.

In operation, for example, the processing unit 12 generates an address signal ADD, a data signal DATA, and a memory control signal Control to the first semiconductor memory 42, thereby accessing a target data. If the target data is not available in the first semiconductor memory 42, then the address signal ADD, the data signal DATA and the memory control signal Control are passed to the second semiconductor memory 44 to access the target data.

A foundry that focuses on DRAM fabrication would typically be familiar with factors relating to simultaneous fabrication of both a memory product (i.e., the memory cell array 142 implemented with a buried-gate transistor) and a logic circuit (i.e., the MPC 140). The processing unit 12 is also a logic circuit. Therefore, such foundry would have the ability to simultaneously manufacture the processing unit 12 and the DRAM 14 on a single semiconductor substrate 20. Under such integration, some of the memory spaces previously provided by the SRAM 124 would be assumed by the DRAM 14, and therefore memory space of the SRAM 124 could be reduced. As a result, a memory density would be relatively high, compared to an existing processing unit that is not fabricated with a DRAM on the same semiconductor substrate.

Moreover, data exchange between the processing unit 12 and the DRAM 14 occurs within the semiconductor device 5. Data exchange with an object external to the semiconductor device 5 is eliminated, or significantly reduced.

In addition, since the processing unit 12 and the DRAM 14 are produced on the same single semiconductor substrate 20, only one chip is produced. No system in package (SiP) is required to stack the processing unit 12 on the DRAM 14. As a result, complexity in design, process and variation can be significantly decreased.

One embodiment of the present disclosure provides a semiconductor device. The semiconductor device includes a semiconductor substrate, a memory cell, a first logic transistor, and a second logic transistor. The semiconductor substrate includes a memory region, and a logic region. The memory cell is disposed in the memory region. The first logic transistor is disposed in the memory region and disposed adjacent to the memory cell. The second logic transistor is disposed in the logic region. The first logic transistor is configured to control operation of the memory cell in response to a memory control signal provided by the second logic transistor.

Another aspect of the present disclosure provides a semiconductor device. The semiconductor device includes a semiconductor substrate, a memory cell, a plurality of first logic transistors, a plurality of second logic transistors and a plurality of third logic transistors. The semiconductor substrate includes a memory region and a logic region. The memory cell is disposed in the memory region. The first logic transistors are disposed in the memory region and surround the memory cell. The second logic transistors are disposed in the logic region. The third logic transistors are disposed on and in the logic region and surround the second logic transistors.

Another aspect of the present disclosure provides a method of fabricating a semiconductor device. The method includes: providing a semiconductor substrate comprising a memory region and a logic region; forming a memory gate in or on the memory region; forming a plurality of first poly-silicon gates on the memory region and surrounding the memory gate; and forming a plurality of second poly-silicon gates on the logic region simultaneously with the formation of the first poly-silicon gates.

The scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
   a semiconductor substrate comprising a memory region and a logic region away from the memory region;
   a memory cell disposed in the memory region;
   a processing unit disposed in the logic region, wherein the processing unit includes a control unit and a processing peripheral circuit communicating between the control unit of the processing unit and the memory cell;
   a plurality of first logic transistors disposed in the memory region and surrounding the memory cell;
   a plurality of second logic transistors disposed in the control unit of the processing unit deposited in the logic region; and
   a plurality of third logic transistors disposed in the processing peripheral circuit of the processing unit deposited in the logic region and surrounding the second logic transistors.

2. The semiconductor device of claim 1, further comprising:
   a guard ring disposed on the semiconductor substrate and surrounding the memory cell, the first logic transistors, the second logic transistors, and the third logic transistors.

3. The semiconductor device of claim 1, further comprising:
   a guard ring disposed on the semiconductor substrate, wherein the memory cell is disposed between the second logic transistor and the guard ring.

* * * * *